(12) United States Patent
Haneda et al.

(10) Patent No.: US 11,005,478 B2
(45) Date of Patent: *May 11, 2021

(54) INTEGRATED CIRCUIT DEVICE, RESONATOR DEVICE, ELECTRONIC DEVICE, AND VEHICLE

(71) Applicant: Seiko Epson Corporation, Tokyo (JP)

(72) Inventors: Hideo Haneda, Matsumoto (JP); Yasuhiro Sudo, Chino (JP)

(73) Assignee: Seiko Epson Corporation

( * ) Notice: Subject to any disclaimer, the term of this patent is extended or adjusted under 35 U.S.C. 154(b) by 171 days.

This patent is subject to a terminal disclaimer.

(21) Appl. No.: 16/257,350

(22) Filed: Jan. 25, 2019

(65) Prior Publication Data

US 2019/0238139 A1    Aug. 1, 2019

(30) Foreign Application Priority Data

Jan. 26, 2018   (JP) .............................. JP2018-011419

(51) Int. Cl.
| | |
|---|---|
| *H03L 1/04* | (2006.01) |
| *H03L 1/02* | (2006.01) |
| *H03B 5/32* | (2006.01) |
| *G06N 3/04* | (2006.01) |
| *G06N 3/08* | (2006.01) |
| *H03B 5/04* | (2006.01) |

(Continued)

(52) U.S. Cl.
CPC ................ *H03L 1/04* (2013.01); *G06N 3/04* (2013.01); *G06N 3/08* (2013.01); *H03B 5/04* (2013.01); *H03B 5/32* (2013.01); *H03H 7/00* (2013.01); *H03L 1/023* (2013.01); *H03M 1/12* (2013.01)

(58) Field of Classification Search
CPC ........................................................ H03L 1/04
USPC ........................................................... 331/69
See application file for complete search history.

(56) References Cited

U.S. PATENT DOCUMENTS

| | | |
|---|---|---|
| 9,092,726 B2 | 7/2015 | Esterline |
| 2008/0061899 A1 | 3/2008 | Stolpman |

(Continued)

FOREIGN PATENT DOCUMENTS

JP            2017-085535 A        5/2017

OTHER PUBLICATIONS

J. Esterline—"Temperature Compensation of Crystal Oscillators Using an Artificial Neural Network," 2012 IEEE International Frequency Control Symposium Proceedings, held May 21-24, 2012, Baltimore, Maryland.

(Continued)

*Primary Examiner* — Joseph Chang
(74) *Attorney, Agent, or Firm* — Harness, Dickey & Pierce, P.L.C.

(57) ABSTRACT

An integrated circuit device includes first and second temperature sensors, an A/D conversion circuit that performs A/D conversion on first and second temperature detection voltages from the first and second temperature sensors and outputs first and second temperature detection data, a connection terminal that is electrically connected to a temperature detection target device of the first and second temperature sensors, and a digital signal processing circuit that performs digital calculation based on the first and second temperature detection data and performs a temperature compensation process of correcting temperature characteristics of the temperature detection target device.

11 Claims, 22 Drawing Sheets

(51) Int. Cl.
*H03H 7/00* (2006.01)
*H03M 1/12* (2006.01)

(56) References Cited

U.S. PATENT DOCUMENTS

| | | | |
|---|---|---|---|
| 2009/0108949 A1* | 4/2009 | Yan | H03B 5/04 |
| | | | 331/158 |
| 2013/0041859 A1 | 2/2013 | Esterlilne | |
| 2013/0328634 A1 | 12/2013 | Filipovic et al. | |
| 2014/0337261 A1 | 11/2014 | Esterline | |
| 2015/0142715 A1 | 5/2015 | Esterline et al. | |
| 2017/0117903 A1 | 4/2017 | Fukuzawa et al. | |
| 2018/0342980 A1 | 11/2018 | Esterline et al. | |

OTHER PUBLICATIONS

U.S. Appl. No. 16/257,288, filed Jan. 25, 2019, Yasuhiro Sudo et al.
U.S. Appl. No. 16/257,492, filed Jan. 25, 2019, Yasuhiro Sudo et al.
Hivert, B and R. Brendel: "Neural Networks Trends for Frequency Control: A Review"; Proceedings of the 1995 IEEE International Frequency Control Symposium (49th Annual Symposium); IEEE; 1995; pp. 10-19.

\* cited by examiner

INTEGRATED CIRCUIT DEVICE, RESONATOR DEVICE, ELECTRONIC DEVICE, AND VEHICLE

BACKGROUND

1. Technical Field

The present invention relates to an integrated circuit device, a resonator device, an electronic device, a vehicle, and the like.

2. Related Art

In the related art, oscillators such as a temperature compensated crystal oscillator (TCXO), an oven controlled crystal oscillator (OCXO), and a simple packaged crystal oscillator (SPXO) are known. For example, TCXO is an oscillator that is set to acquire a stable oscillation frequency with respect to a change in ambient temperature by compensating the temperature characteristics of the oscillation frequency of a quartz crystal resonator. TCXO is used as a reference signal source or the like in, for example, a portable communication terminal, a GPS-related device, a wearable device, or a vehicle-mounted device.

For example, TCXO that performs a temperature compensation process by digital calculation is disclosed in JP-A-2017-85535.

A temperature sensor used in the temperature compensation process is disposed in an integrated circuit device of the oscillator. Meanwhile, a resonator that generates an oscillation signal is disposed as a separate body from the integrated circuit device. A delay in heat conduction that corresponds to heat conduction between the resonator and the temperature sensor occurs depending on the structure of the oscillator. Thus, the temperature of the resonator cannot be correctly measured by the temperature sensor. Consequently, the temperature compensation process that uses temperature detection data may not be executed with high accuracy.

In addition, in a device other than the oscillator, a delay in heat conduction occurs between the temperature sensor and a temperature detection target device of the temperature sensor, and the temperature of the temperature detection target device may not be correctly measured by the temperature sensor. In this case, a process that uses the temperature detection data cannot be executed with high accuracy.

SUMMARY

An advantage of some aspects of the invention is to solve at least a part of the problems described above, and the invention can be implemented as the following forms or aspects.

An aspect of the invention relates to an integrated circuit device, electrically coupled to a temperature detection target device, including a first temperature sensor, a second temperature sensor, an A/D conversion circuit that performs A/D conversion on a first temperature detection voltage from the first temperature sensor and outputs first temperature detection data, and performs A/D conversion on a second temperature detection voltage from the second temperature sensor and outputs second temperature detection data, a connection terminal electrically coupled to the temperature detection target device, and a digital signal processing circuit that performs digital calculation based on the first temperature detection data and the second temperature detection data and performs a temperature compensation process of correcting temperature characteristics of the temperature detection target device.

In the aspect of the invention, the temperature characteristics of the temperature detection target device are corrected based on the temperature detection data from a plurality of temperature sensors disposed in the integrated circuit device. By doing so, a decrease in process accuracy caused by a difference (difference in temperature) between a temperature in the temperature sensor and the temperature of the temperature detection target device can be reduced.

In the aspect of the invention, the integrated circuit device may further include a power supply terminal where a power supply voltage is supplied, and an output terminal from which a signal is output. A distance between the first temperature sensor and the connection terminal may be smaller than at least one of a distance between the first temperature sensor and the power supply terminal and a distance between the first temperature sensor and the output terminal.

The connection terminal constitutes a main heat conduction path between the integrated circuit device and the temperature detection target device. As described above, by disposing the temperature sensor at a position closer to the connection terminal than the power supply terminal or the output terminal, a change in temperature based on heat conduction to a resonator is easily detected. Thus, the accuracy of the temperature compensation process in which heat conduction between the integrated circuit device and the temperature detection target device is considered can be improved.

In the aspect of the invention, the integrated circuit device may further include a support terminal in which an electrode for supporting the temperature detection target device is disposed. A distance between the second temperature sensor and the support terminal may be smaller than at least one of a distance between the second temperature sensor and the power supply terminal and a distance between the second temperature sensor and the output terminal.

The support terminal is a terminal that is used for connection between the integrated circuit device and the temperature detection target device. Thus, the support terminal constitutes a main heat conduction path between the integrated circuit device and the temperature detection target device. As described above, by disposing the temperature sensor at a position closer to the support terminal than the power supply terminal or the output terminal, a change in temperature based on heat conduction to the resonator is easily detected. Thus, the accuracy of the temperature compensation process in which heat conduction between the integrated circuit device and the temperature detection target device is considered can be improved.

In the aspect of the invention, the integrated circuit device may further include a support terminal in which an electrode for supporting a relay substrate in which wiring that electrically connects the temperature detection target device and the integrated circuit device is formed is disposed. A distance between the second temperature sensor and the support terminal may be smaller than at least one of a distance between the second temperature sensor and the power supply terminal and a distance between the second temperature sensor and the output terminal.

Even with the relay substrate, the support terminal is a terminal that is used for connection between the integrated circuit device and the resonator. Thus, the support terminal constitutes a main heat conduction path between the integrated circuit device and the resonator. By disposing the temperature sensor at a position closer to the support terminal than the power supply terminal or the output terminal, a change in temperature based on heat conduction to the resonator is easily detected. Thus, the accuracy of the temperature compensation process in which heat conduction between the integrated circuit device and the temperature detection target device is considered can be improved.

In the aspect of the invention, the digital signal processing circuit may correct the temperature characteristics of the temperature detection target device by a neural network calculation process based on the first temperature detection data and the second temperature detection data.

With this configuration, the temperature compensation process can be performed using the neural network calculation.

In the aspect of the invention, the digital signal processing circuit may correct the temperature characteristics of the temperature detection target device by the neural network calculation process based on an amount of change in time of at least one of the first temperature detection data and the second temperature detection data.

With this configuration, the neural network calculation in which heat conduction between the integrated circuit device and the temperature detection target device is considered can be performed. Thus, the accuracy of the temperature compensation process can be improved.

In the aspect of the invention, the digital signal processing circuit may perform a heat circuit simulation process using heat resistance information and heat capacitance information related to a heat conduction model based on the first temperature detection data and the second temperature detection data and estimate a temperature of the temperature detection target device.

With this configuration, the temperature estimation process or the temperature compensation process can be performed by heat circuit simulation.

Another aspect of the invention relates to an integrated circuit device including a temperature sensor, an A/D conversion circuit that performs A/D conversion on a temperature detection voltage from the temperature sensor and outputs temperature detection data, a connection terminal for electrically connecting to a temperature detection target device which is a temperature detection target of the temperature sensor, and a digital signal processing circuit that performs a temperature compensation process of correcting temperature characteristics of the temperature detection target device by a neural network calculation process based on the temperature detection data and an amount of change in time of the temperature detection data.

In the aspect of the invention, the temperature characteristics of the temperature detection target device are corrected by the neural network calculation based on the amount of change in time of the temperature detection data. By doing so, a decrease in process accuracy caused by a difference (difference in temperature) between a temperature in the temperature sensor and the temperature of the temperature detection target device can be reduced. At this point, a high accuracy temperature compensation process in which heat conduction is considered can be performed using the amount of change in time as the input of the neural network calculation.

In the aspect of the invention, the temperature detection target device may be a resonator, and the integrated circuit device may include a drive circuit that drives the resonator.

With this configuration, the temperature characteristics of the resonator can be corrected with high accuracy.

Still another aspect of the invention relates to a resonator device including a resonator and a integrated circuit device. The integrated circuit device includes a first temperature sensor, a second temperature sensor, an A/D conversion circuit that performs A/D conversion on a first temperature detection voltage from the first temperature sensor and outputs first temperature detection data, and performs A/D conversion on a second temperature detection voltage from the second temperature sensor and outputs second temperature detection data a connection terminal electrically coupled to the resonator, and a digital signal processing circuit that performs digital calculation based on the first temperature detection data and the second temperature detection data and performs a temperature compensation process of correcting temperature characteristics of the resonator.

In the aspect of the invention, the temperature characteristics of the resonator are corrected based on the temperature detection data from a plurality of temperature sensors disposed in the integrated circuit device. By doing so, a decrease in process accuracy caused by a difference (difference in temperature) between a temperature in the temperature sensor and the temperature of the resonator can be reduced.

In the aspect of the invention, the resonator may be supported by the integrated circuit device through the connection terminal.

With this configuration, heat conduction between a unit other than the integrated circuit and the resonator can be reduced, and a higher accuracy temperature compensation process can be performed.

Still another aspect of the invention relates to an electronic device including the integrated circuit device.

Still another aspect of the invention relates to a vehicle including the integrated circuit device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an exemplary embodiment of the invention will be described in detail. The embodiment described below does not unduly limit the content of the invention disclosed in the appended claims, and not all configurations described in the embodiment are necessarily a solution of the invention.

1. Method of Embodiment

First, a method of the embodiment will be described. An oscillator such as TCXO is used as a reference signal source or the like in various devices. For example, while frequency division duplex (FDD) is used thus far as a communication scheme between a base station and a communication terminal, time division duplex (TDD) is used in a next generation communication scheme such as 5G. In the TDD scheme, data is transmitted and received in a time division manner using the same frequency in an uplink and a downlink, and a guard time is set between time slots allocated to each device. Thus, in order to implement appropriate communication, each device needs to synchronize time, and accurate tracking of absolute time is required. In addition, in the case of using the oscillator as a reference signal source, a problem of so-called holdover arises. For example, frequency fluctuation can be reduced by synchronizing the oscillation signal (output signal) of the oscillator with a reference signal from GPS or a network using a PLL circuit. However, in a case where the holdover in which the reference signal from GPS or the network (Internet) is lost or affected occurs, the reference signal for synchronization cannot be acquired. Accordingly, in a case where such holdover occurs, the absolute time needs to be tracked on the oscillator side in the absence of the reference signal, and communication fails in a case where the tracked time deviates. Thus, the oscillator requires very high frequency stability even in the holdover period.

Figure 1:
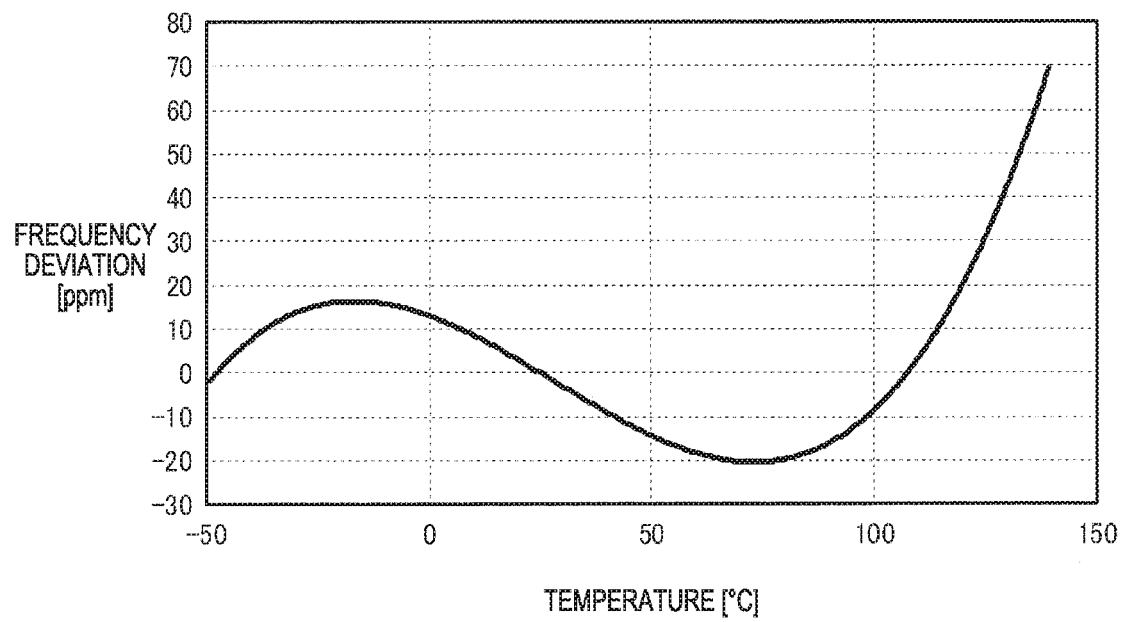
FIG. 1 is an example of the temperature characteristics of a resonator.

The temperature characteristics of a resonator are considered to be a cause of decrease in the accuracy of the temperature characteristics of a quartz crystal resonator. A horizontal axis denotes a temperature, and a vertical axis denotes a frequency deviation (an error with respect to a set frequency). As illustrated in FIG. 1, the quartz crystal resonator has temperature characteristics similar to a cubic function. An integrated circuit device (in a narrow sense, DPS) of the oscillator executes a temperature compensation process that reduces fluctuation of the oscillation frequency accompanied by temperature fluctuation. For example, as will be described using FIG. 9, a digital signal processing circuit 23 (DSP) outputs frequency control data DDS based on temperature detection data TD, and an oscillation signal generation circuit 40 controls the oscillation frequency of a resonator 10 based on the frequency control data DDS.

As illustrated in FIG. 1, the temperature of the resonator 10 is important in the temperature compensation process. Thus, it is considered that the temperature compensation process can be executed with sufficient accuracy in a case where the temperature of the resonator 10 is used. However, it is not easy to dispose a temperature sensor 26 in the resonator 10. The temperature sensor 26 is disposed in a location, particularly, an integrated circuit device 20, other than the resonator 10. In a case where there is a difference between the temperature in the temperature sensor 26 and the temperature of the resonator 10, the accuracy of the temperature compensation process decreases due to the difference.

Figure 2:
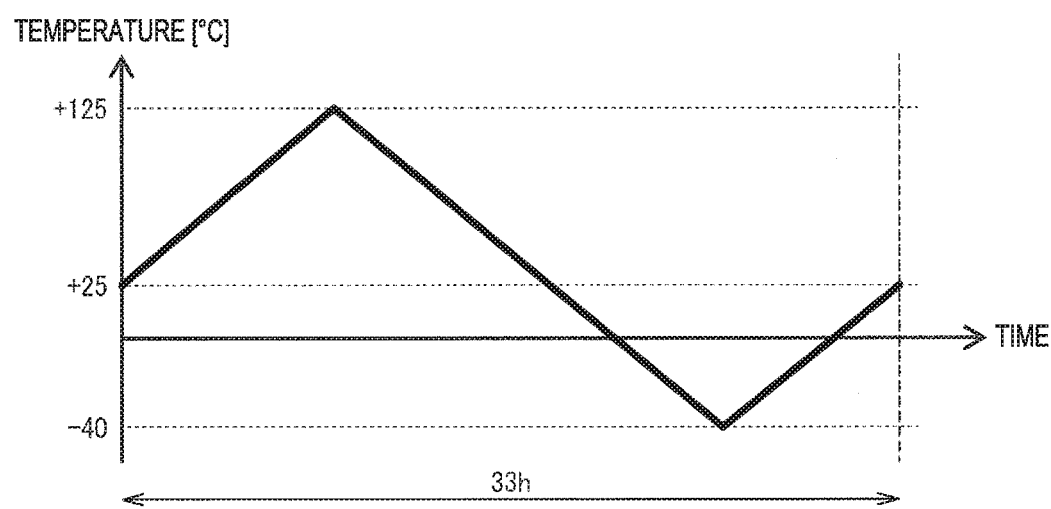
FIG. 2 is an example of a temperature sweep in an inspection step.

FIG. 2 is an example of a temperature sweep in an inspection step. In FIG. 2, a horizontal axis denotes time, and a vertical axis denotes the temperature of a constant temperature chamber used in the inspection step. In the example in FIG. 2, a control that increases the temperature to +125° C. from +25° C. as a starting point, then performs cooling to −40° C., and then, returns the temperature to +25° C. is performed for 33 hours. Usually, in the inspection step, the temperature sweep is performed as in FIG. 2, and the temperature detection data TD and the frequency control data DDS at that point are obtained. A process of determining the parameters of the temperature compensation process (for example, the coefficient of a polynomial approximation function) is executed using the obtained values as learning data (training data).

Figure 3:
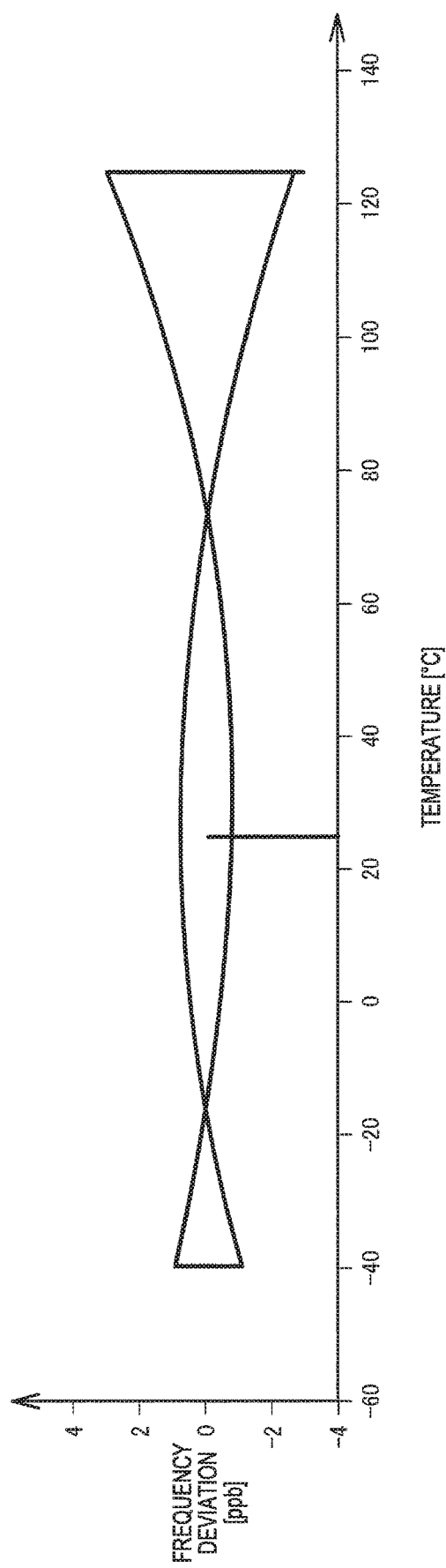
FIG. 3 is an example of a relationship between a temperature and a frequency deviation during the temperature sweep.

FIG. 3 is a diagram representing a simulation result of the temperature compensation process in a case where the temperature sweep illustrated in FIG. 2 is performed. In FIG. 3, a horizontal axis denotes time, and a vertical axis denotes the frequency deviation (unit: ppb). In FIG. 3, heat conduction between the integrated circuit device 20 and the resonator 10 is regarded as a low pass filter (hereinafter, referred to as LPF), and a simple correction system that performs the temperature compensation process based on polynomial approximation using a signal acquired after a low pass filter process on a temperature signal is assumed. As the cutoff frequency of LPF is decreased, a delay in heat conduction between the temperature sensor 26 and the resonator 10 is extended. As the cutoff frequency of LPF is increased, a delay in heat conduction between the temperature sensor 26 and the resonator 10 is shortened. FIG. 3 illustrates a simulation result in a case where the cutoff frequency is set to 1 Hz (the heat conduction delay is one second).

As is understood from FIG. 3, in a case where the cutoff frequency is 1 Hz, the width of the frequency deviation is increased to a certain degree. Specifically, even at the same temperature, the frequency deviation after the temperature compensation process varies at an increase in temperature and at a decrease in temperature (hysteresis occurs). This simulation result indicates that even in a case where the heat conduction delay between the temperature sensor 26 and the resonator 10 is approximately one second, the delay causes the temperature compensation process not to be executed with sufficient accuracy. In a case where the cutoff frequency is high (that is, in a case where the heat conduction delay is short), the frequency deviation can be restricted to fall within a narrow range. However, as is understood from FIG. 3, the allowed heat conduction delay for acquiring sufficient accuracy is shorter than one second.

Figure 4:
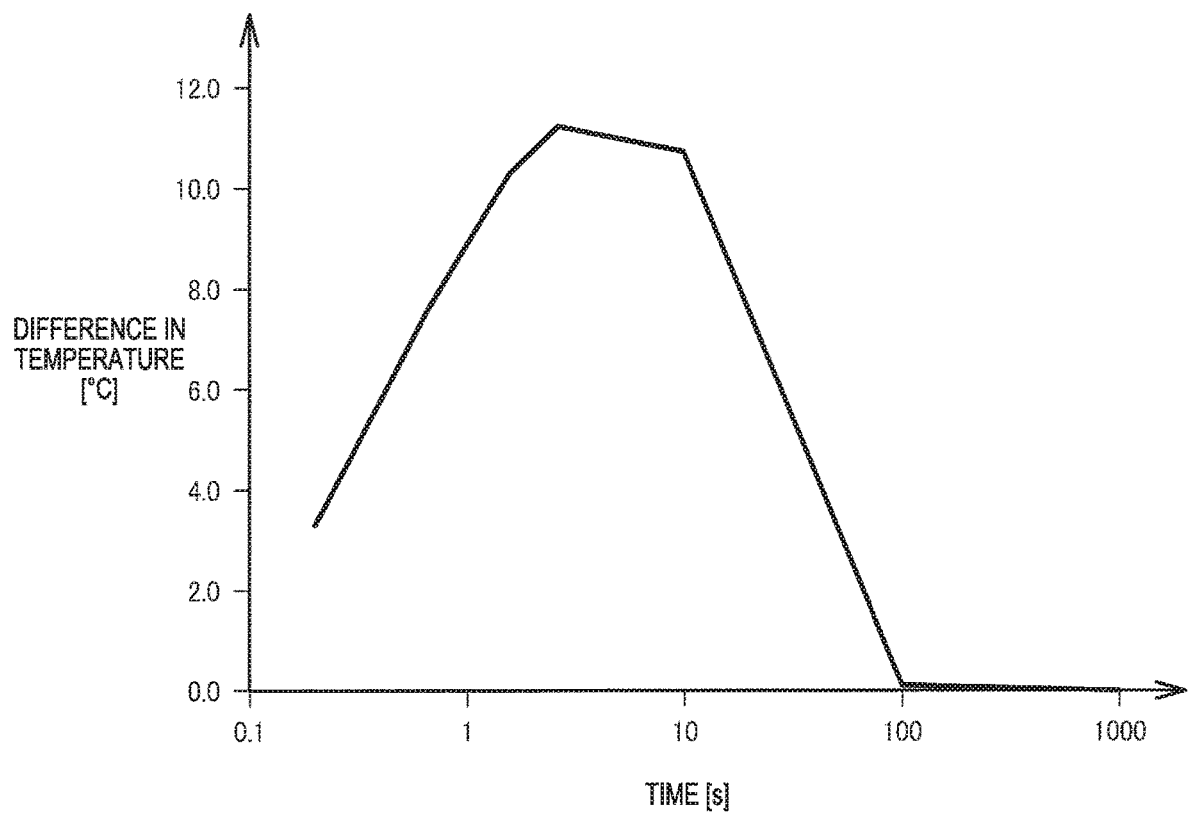
FIG. 4 is an example of a difference in temperature between a detection temperature of a temperature sensor and the temperature of the resonator.

FIG. 4 is a diagram for describing heat conduction between the temperature sensor 26 and the resonator 10. In FIG. 4, a horizontal axis denotes the logarithm of elapsed time, and a vertical axis denotes a difference in temperature between the temperature sensor 26 and the resonator 10. FIG. 4 is the result of simulation of a state where heat is generated from a given circuit of the integrated circuit device as a heat source, and the heat propagates. As illustrated in FIG. 4, first, the temperature of the temperature sensor 26 that is relatively close to the heat source is increased, and the difference in temperature with the resonator 10 is increased. Since heat is also transmitted to the resonator 10 along with an elapse of time, the temperature of the resonator 10 is also increased, and the difference in temperature between the temperature sensor 26 and the resonator 10 is soon decreased to zero.

As is understood from FIG. 4, a delay of approximately 100 seconds is present in heat conduction between the temperature sensor 26 and the resonator 10. That is, setting the heat conduction delay to be shorter than one second is not realistic. From FIG. 3 and FIG. 4, it is understood that the heat conduction delay between the temperature sensor 26 and the resonator 10 cannot be ignored as a cause of decreasing the accuracy of the temperature compensation process. Specifically, in the case of focusing on a given temperature, the oscillation frequency changes depending on whether the given temperature is a temperature at the time of increase or a temperature at the time of decrease, or depending on the degree of a temperature gradient. Thus, simply using the temperature detection data cannot distinguish between those situations. That is, in order to perform the temperature compensation process with high accuracy, a process that considers heat conduction between the integrated circuit device 20 and the resonator 10 needs to be performed.

The temperature compensation process in the oscillator such as TCXO is described above. However, in other devices, heat conduction (difference in temperature) between the temperature sensor 26 and a temperature detection target device as a temperature detection target of the temperature sensor 26 may pose problems in processes. For example, in a physical quantity measurement device such as a gyrosensor it is known that a zero point (an output value in a case where a physical quantity such as an angular velocity is equal to zero) changes depending on the temperature characteristics of the resonator 10, and a zero point correction process based on the temperature detection data is performed. In the physical quantity measurement device, in a case where a difference in temperature occurs between the temperature detected by the temperature sensor and the temperature detection target device (resonator), the difference in temperature is a cause of decrease in the accuracy of the zero point correction process.

Meanwhile, the integrated circuit device 20 according to the embodiment includes a first temperature sensor 26, a second temperature sensor 26, an A/D conversion circuit 27 that performs A/D conversion on a first temperature detection voltage from the first temperature sensor 26 and outputs first temperature detection data TD1 and performs A/D conversion on a second temperature detection voltage from the second temperature sensor 26 and outputs second temperature detection data TD2, a connection terminal that is electrically connected to the temperature detection target device as a temperature detection target of the first temperature sensor and the second temperature sensor, and the digital signal processing circuit 23 that performs digital calculation based on the first temperature detection data TD1 and the second temperature detection data TD2 and performs the temperature compensation process of correcting the temperature characteristics of the temperature detection target device. The temperature compensation process may be a process that is performed based on a temperature estimation value by estimating the temperature of the temperature detection target device (hereinafter, referred to as a temperature estimation value), or may be a process of directly obtaining temperature compensation data (for example, the frequency control data DDS). The number of temperature sensors 26 can be expanded to three or more. Thus, hereinafter, the temperature sensor 26 will be referred to as first to N-th (N is an integer greater than or equal to two) temperature sensors 26.

The integrated circuit device 20 represents a device in which the circuits such as the A/D conversion circuit 27, the digital signal processing circuit 23, and the oscillation signal generation circuit 40 and the temperature sensors 26 are integrated in one chip.

By doing so, the temperature of the temperature detection target device can be estimated based on a plurality of pieces of temperature detection data from the plurality of temperature sensors 26. In a case where the integrated circuit device 20 is included in the resonator, the temperature detection target device is the resonator 10, and the temperature compensation process for the oscillation frequency can be executed with accuracy by estimating the temperature of the resonator 10. In addition, in a case where the integrated circuit device 20 is included in the physical quantity measurement device (for example, a gyrosensor), the temperature detection target device is the resonator, and the zero point correction process or the like can be executed with accuracy by estimating the temperature of the resonator. In other devices, a problem such as a decrease in accuracy caused by a difference (difference in temperature) between the temperature detected by the temperature sensor 26 and the temperature of the temperature detection target device can be reduced using the integrated circuit device 20 of the embodiment.

Figure 13:
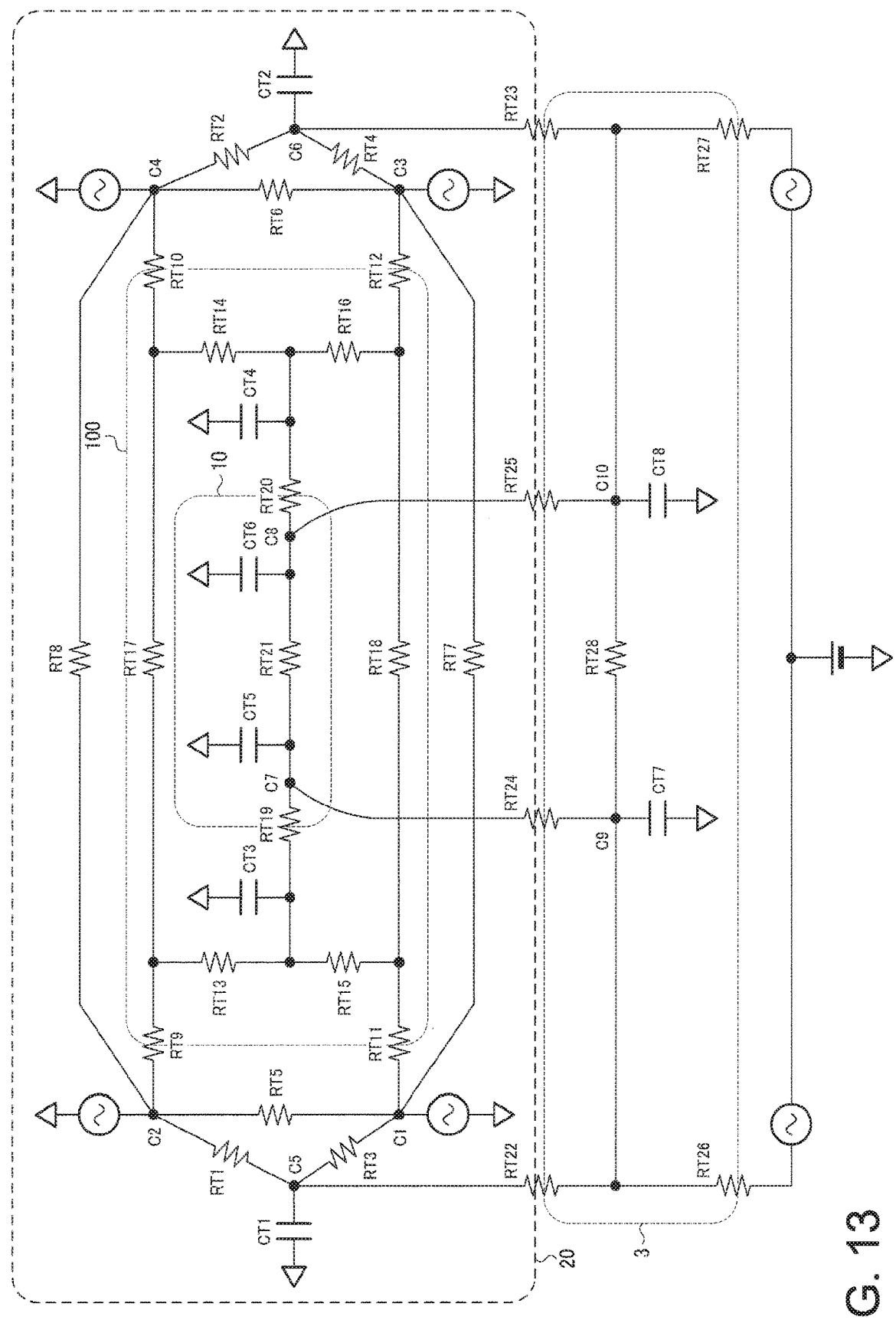
FIG. 13 is an example of a heat conduction model of the resonator device (oscillator).
Figure 18:
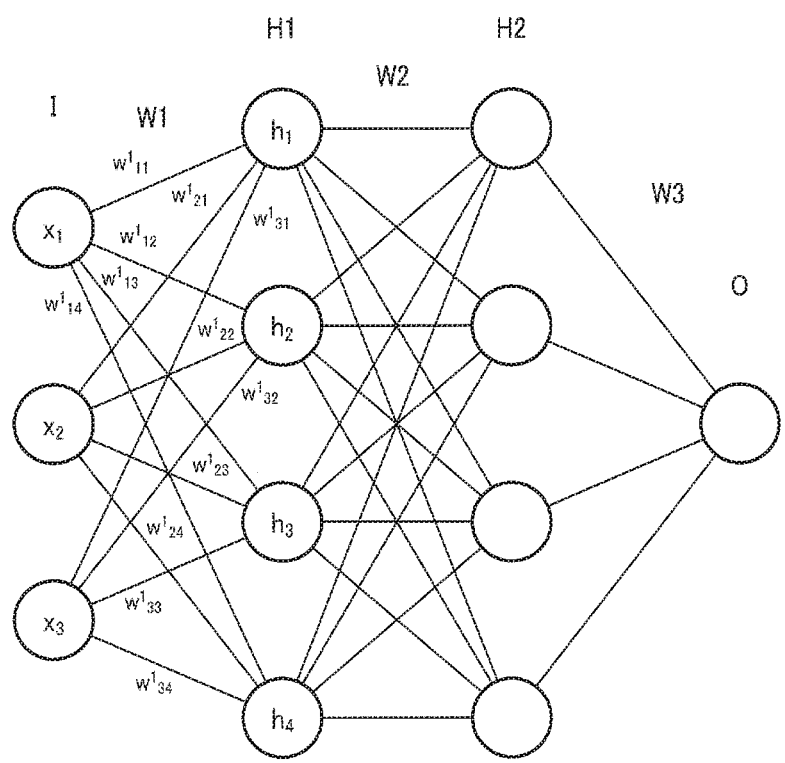
FIG. 18 is a descriptive diagram of a neural network.

Particularly, in the embodiment, accuracy can be improved using the plurality of temperature sensors 26, compared to that in a case where a single temperature sensor is used. For example, in a case where a heat conduction model (heat circuit) described below using FIG. 13 is used for estimation of the temperature of the temperature detection target device, the electric potentials of a plurality of nodes are set as the input of a heat circuit simulation process. Thus, the accuracy of estimating the electric potential (temperature estimation value) of a node corresponding to the temperature detection target device can be increased, compared to that in a case where the electric potential of one node is set as input. Alternatively, in a case where a neural network described below using FIG. 18 is used for estimation of the temperature of the temperature detection target device, the number of inputs can be increased. Thus, estimation accuracy can be increased.

In addition, the method of the embodiment can be applied to the integrated circuit device 20 including the temperature sensor 26, the A/D conversion circuit 27 that performs A/D conversion on a temperature detection voltage from the temperature sensor 26 and outputs the temperature detection data TD, the connection terminal for electrically connecting to the temperature detection target device as a temperature detection target of the temperature sensor 26, and the digital signal processing circuit 23 that performs a temperature estimation process of estimating the temperature of the temperature detection target device or the temperature compensation process of correcting the temperature characteristics of the temperature detection target device by a neural network calculation process based on the temperature detection data TD and the amount of change in time of the temperature detection data.

The amount of change in time of the temperature detection data TD represents the amount of change of the temperature detection data TD per predetermined time. For example, the amount of change in time of the temperature detection data TD is information related to the difference between the temperature detection data corresponding to a process target timing and the temperature detection data acquired at a timing earlier than the process target timing (in a narrow sense, the immediately previous timing).

By using the amount of change in time of the temperature detection data TD as an input of the neural network calculation, whether the temperature detection data TD is a temperature at the time of increase or at the time of decrease can be distinguished even in a case where the value of the temperature detection data TD is the same. In addition, the magnitude of the amount of change in time represents the rapidness of a change in temperature. Thus, a rapid change in temperature and a gradual change in temperature can be distinguished. That is, since the neural network calculation in which heat conduction is considered can be performed using the amount of change in time, the temperature estimation process for the temperature detection target device or the temperature compensation process of correcting the temperature characteristics can be performed with high accuracy.

In a case where the temperature of the temperature detection target device is estimated using the neural network, the above two methods may be combined. That is, the integrated circuit device 20 includes the first to N-th (N is an integer greater than or equal to two) temperature sensors 26, the A/D conversion circuit 27 that performs A/D conversion on the first to N-th temperature detection voltages from the first to N-th temperature sensors 26 and outputs first to N-th temperature detection data TD1 to TDN, the connection terminal that is electrically connected to the temperature detection target device of the first to N-th temperature sensors, and the digital signal processing circuit 23. The digital signal processing circuit 23 estimates the temperature of the temperature detection target device by the neural network calculation process based on the first to N-th temperature detection data TD1 to TDN and the amount of change in time of i-th (i is an integer satisfying 1≤i≤N) temperature detection data TDi. Either a configuration that uses the plurality of temperature sensors 26, or a configuration that uses the amount of change in time may not be included.

2. Configuration Example

Figure 5:
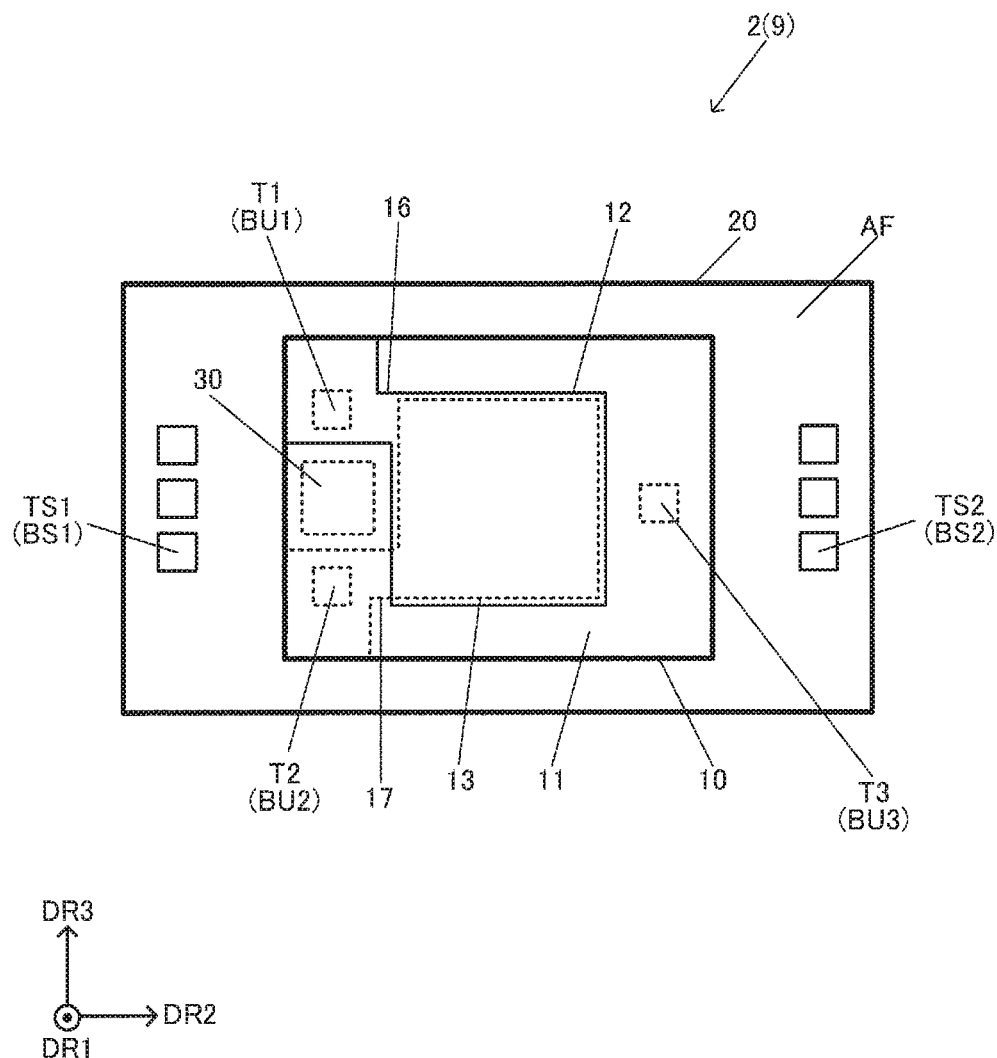
FIG. 5 is a plan view illustrating a configuration of a resonator device including an integrated circuit device and the resonator.
Figure 6:
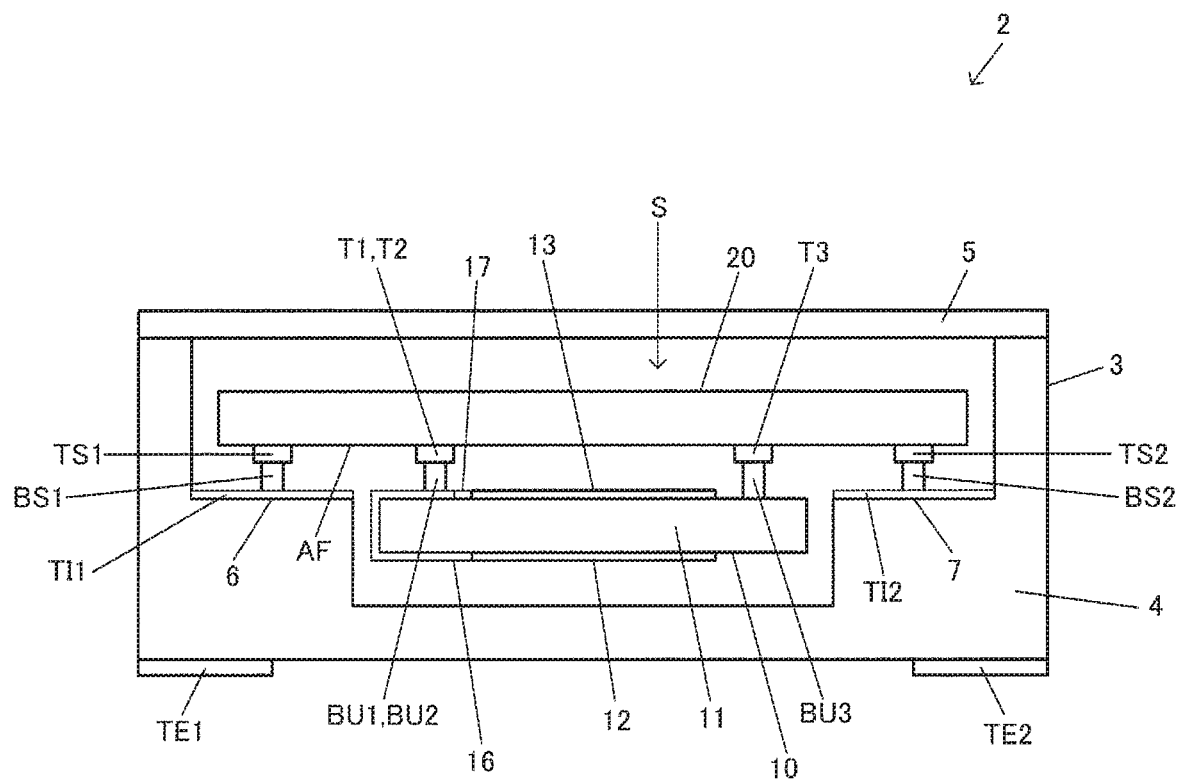
FIG. 6 is a sectional view illustrating a configuration of the resonator device including the integrated circuit device and the resonator.
Figure 6:
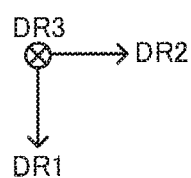

FIG. 5 and FIG. 6 illustrate a configuration example of a resonator device 2 (an oscillator or a physical quantity measurement device) that includes the integrated circuit device 20 of the embodiment. FIG. 5 is a plan view illustrating the resonator device 2 of the embodiment, and FIG. 6 is a sectional view (side view) of the resonator device 2. The resonator device 2 includes the integrated circuit device 20 (IC) that includes the resonator 10 and a drive circuit 30 which drives the resonator 10. In addition, the resonator device 2 can further include a package 3 on which the resonator 10 and the integrated circuit device 20 are mounted. The resonator 10 is disposed on an active surface AF side (circuit element surface side) of the integrated circuit device 20. The active surface AF is a surface on which an active element (circuit element) such as a transistor of the integrated circuit device 20 is formed. In FIG. 5 and FIG. 6, a direction from the integrated circuit device 20 toward the resonator 10 is denoted by DR1 (first direction). The direction DR1 is a direction that is orthogonal to a semiconductor substrate of the integrated circuit device 20. In addition, directions that are orthogonal to the direction DR1 are denoted by directions DR2 and DR3 (second and third directions). For example, the direction DR2 is a direction in the long edge direction of the integrated circuit device 20, and the direction DR3 is a direction in the short edge direction of the integrated circuit device 20. The resonator device 2 is not limited to the configurations in FIG. 5 and FIG. 6. Various modifications can be made such that a part of the constituents is not included, or another constituent is added.

The resonator 10 is an element (resonating element) that generates mechanical resonance by an electric signal. The resonator 10 can be implemented by a resonator element (piezoelectric resonator element) such as a quartz crystal resonator element. For example, the resonator 10 can be implemented by a quartz crystal resonator element that has a cut angle of AT cut or SC cut and generates thickness-shear resonance. For example, the resonator 10 is a resonator incorporated in a temperature compensated oscillator (TCXO) that does not include a constant temperature chamber. Alternatively, the resonator 10 may be a resonator or the like incorporated in a constant temperature chamber type oscillator (OCXO) that includes a constant temperature chamber. The resonator 10 of the embodiment can be implemented by various resonator elements such as a resonator element of a type other than a thickness-shear resonance type and a piezoelectric resonator element formed of a material other than quartz crystal. For example, a surface acoustic wave (SAW) resonator or a micro electro mechanical systems (MEMS) resonator as a silicon resonator that is formed using a silicon substrate can be employed as the resonator 10.

The resonator 10 includes a resonator element 11 (resonating substrate) and electrodes 12 and 13. The resonator element 11 is formed of a piezoelectric material. For example, the resonator element 11 is formed of quartz crystal. In a case where the surface of the resonator element 11 on the opposite side from the integrated circuit device 20 is referred to as a first surface, and the surface of the resonator element 11 on the integrated circuit device 20 side is referred to as a second surface, the electrode 12 is formed on the first surface of the resonator element 11, and the electrode 13 is formed on the second surface of the resonator element 11. In addition, the resonator 10 includes a terminal, not illustrated, and is electrically connected to a terminal of the integrated circuit device 20 through the terminal.

The integrated circuit device 20 has a rectangular shape in a plan view of the active surface AF and includes a semiconductor substrate. An active element such as a transistor is formed on the active surface AF of the semiconductor substrate. In addition, a passive element such as a resistor or a capacitor may be formed on the active surface AF. The rectangular shape referred hereto may not necessarily be a complete rectangular shape. The rectangular shape that partially has a projected shape or a recessed shape or has a curved edge is allowed.

The integrated circuit device 20 includes the drive circuit 30 that drives the resonator 10. In addition, the integrated circuit device 20 includes a terminal T1 (a first terminal, corresponding to a connection terminal) that is electrically connected to the electrode 12 (first electrode) of the resonator 10 and is where an output signal is output to the resonator 10 from the drive circuit 30, and a terminal T2 (a second terminal, corresponding to a connection terminal) that is electrically connected to the electrode 13 (second electrode) of the resonator 10 and is where an input signal is input into the drive circuit 30 from the resonator 10. In addition, the integrated circuit device 20 further includes a terminal T3 (a third terminal, corresponding to a connection terminal) that is not electrically connected to the electrodes 12 and 13 (first and second electrodes) of the resonator 10. In addition, the integrated circuit device 20 may include terminals TS1 and TS2. While an example in which each of TS1 and TS2 includes three terminals is illustrated in FIG. 5, various modifications can be made for the specific number of terminals. TS1 or TS2 includes a terminal that is supplied with a high electric potential side power supply voltage VDD. In addition, TS1 or TS2 includes a terminal that is supplied with a low electric potential side power supply voltage VSS (for example, GND). That is, the terminals TS1 and TS2 include a power supply terminal for power supply, and the integrated circuit device 20 operates by the supply of the power supply voltages VDD and VSS. In addition, the terminals TS1 and TS2 include a signal terminal where various signals are output or input. For example, the terminals T1 to T3, TS1, and TS2 are called pads of the integrated circuit device 20. Being electrically connected means connection such that an electric signal is transmitted and delivered through wiring or the like. Being not electrically connected means that transmission of an electric signal is blocked, and the electric signal is not delivered.

For example, the integrated circuit device 20 drives the resonator 10 by the output signal (drive signal) of the drive circuit 30. The drive circuit 30 is implemented by, for example, an inverting amplification circuit (inverter circuit). An output signal OUT of the drive circuit 30 is output to the resonator 10 (electrode 12) through the terminal T1. In addition, an input signal IN (feedback signal) from the resonator 10 (electrode 13) is input into the drive circuit 30 through the terminal T2. Accordingly, an oscillation signal (clock signal) of a predetermined oscillation frequency can be generated by oscillating the resonator 10.

As illustrated in FIG. 6, the resonator device 2 includes the package 3 that is formed of ceramic or the like. The package 3 has an accommodation space S inside, and the resonator 10 and the integrated circuit device 20 are accommodated in the accommodation space S. The accommodation space S is airtightly sealed and is in a depressurized state (desirably, a state similar to a vacuum). The package 3 enables the resonator 10 and the integrated circuit device 20 to be properly protected from impact, dust, heat, moisture, and the like. The package 3 includes a base 4 and a lid 5. Specifically, the package 3 is configured with the base 4 that supports the resonator 10 and the integrated circuit device 20, and the lid 5 that is joined to the upper surface of the base 4 such that the accommodation space S is formed between the base 4 and the lid 5.

As illustrated in the sectional view of FIG. 6, the base 4 includes a first recess portion and a second recess portion inside. The first recess portion is open on the upper surface of the base 4. The second recess portion is open on the bottom surface of the first recess portion. Step portions 6 and 7 are disposed on the bottom surface of the first recess portion. Internal terminals TI1 and TI2 of the resonator device 2 are formed in the step portions 6 and 7. The internal terminals TI1 and TI2 are electrically connected to external terminals TE1 and TE2 of the resonator device 2 through internal wiring (not illustrated) of the package 3. The external terminals TE1 and TE2 are formed on the outer bottom surface of the package 3. The external terminals TE1 and TE2 are connected to external devices through external wiring (wiring and the like of a circuit substrate). For example, the terminals TS1 and TS2 are disposed in the integrated circuit device 20, and conductive bumps BS1 and BS2 are disposed in the signal terminals TS1 and TS2. As illustrated in FIG. 6, the conductive bumps BS1 and BS2 of the signal terminals TS1 and TS2 are connected in contact to the internal terminals TI1 and TI2 of the resonator device 2. Accordingly, the signal terminals TS1 and TS2 of the integrated circuit device 20 are electrically connected to the external terminals TE1 and TE2 of the resonator device 2.

FIG. 5 is a plan view of the active surface AF of the integrated circuit device 20 and, for example, is a view seen from a direction opposite to the direction DR1. In the plan view of the active surface AF, the terminals T1, T2, and T3 of the integrated circuit device 20 are arranged to overlap with the resonator 10. As illustrated in the sectional view (a view seen from the direction DR3) of FIG. 6, the resonator 10 and the integrated circuit device 20 are attached to each other as a stack in their thickness direction. A unit in which the resonator 10 and the integrated circuit device 20 are attached to each other as a stack is called a resonator unit 9 (stack body).

As illustrated in FIG. 6, conductive bumps BU1, BU2, and BU3 (connection bumps) are disposed in the terminals T1, T2, and T3 of the integrated circuit device 20. The conductive bumps BU1, BU2, and BU3 are connection electrodes of a protrusion shape that are formed on the terminals T1, T2, and T3. For example, the conductive bumps BU1, BU2, and BU3 are metal bumps (gold bumps, silver bumps, copper bumps, or the like) formed of metal. A modification can be made such that a resin core bump that is configured by plating the core of a bump formed of resin with metal is used as the conductive bump.

The terminal T1 is electrically connected to the electrode 12 of the resonator 10 through a conductive bump B1. Specifically, as illustrated in FIG. 5 and FIG. 6, wiring 16 that is connected to the electrode 12, and a first connection terminal, not illustrated, that is connected to the wiring 16 are disposed in the resonator 10. The terminal T1 and the electrode 12 are electrically connected to each other through the conductive bump B1, the first connection terminal, and the wiring 16 by connecting the conductive bump B1 of the terminal T1 to the first connection terminal. In addition, the terminal T2 is electrically connected to the electrode 13 of the resonator 10 through a conductive bump B2. Specifically, wiring 17 that is connected to the electrode 13, and a second connection terminal, not illustrated, that is connected to the wiring 17 are disposed in the resonator 10. In FIG. 5, the electrode 13 and the wiring 17 are illustrated by dotted lines. The terminal T2 and the electrode 13 are electrically connected to each other through the conductive bump B2, the second connection terminal, and the wiring 17 by connecting the conductive bump B2 of the terminal T2 to the second connection terminal. While a case where the terminal T1 and the electrode 12 are electrically connected to each other, and the terminal T2 and the electrode 13 are electrically connected to each other is described above, the embodiment is not limited thereto. The terminal T1 and the electrode 13 may be electrically connected to each other, and the terminal T2 and the electrode 12 may be electrically connected to each other. For example, the electrode 13 may be the first electrode, and the electrode 12 may be the second electrode.

Meanwhile, the terminal T3 of the integrated circuit device 20 is a dummy terminal that is not electrically connected to the electrodes 12 and 13 of the resonator 10. For example, the conductive bump BU3 is formed in the terminal T3. The conductive bump BU3 is in contact with the resonator 10 but is not electrically connected to the electrodes 12 and 13 of the resonator 10. For example, the terminals T1 and T2 of the integrated circuit device 20 are connected to the first and second connection terminals of the resonator 10, but the terminal T3 is not connected to the first and second connection terminals.

The resonator 10 is supported on the active surface AF side of the integrated circuit device 20 using the conductive bumps BU1, BU2, and BU3 disposed in the terminals T1, T2, and T3. For example, the conductive bumps BU1, BU2, and BU3 (and the terminals T1, T2, and T3) are support members, and the resonator 10 is supported (supported at three points) by the integrated circuit device 20.

Figure 7:
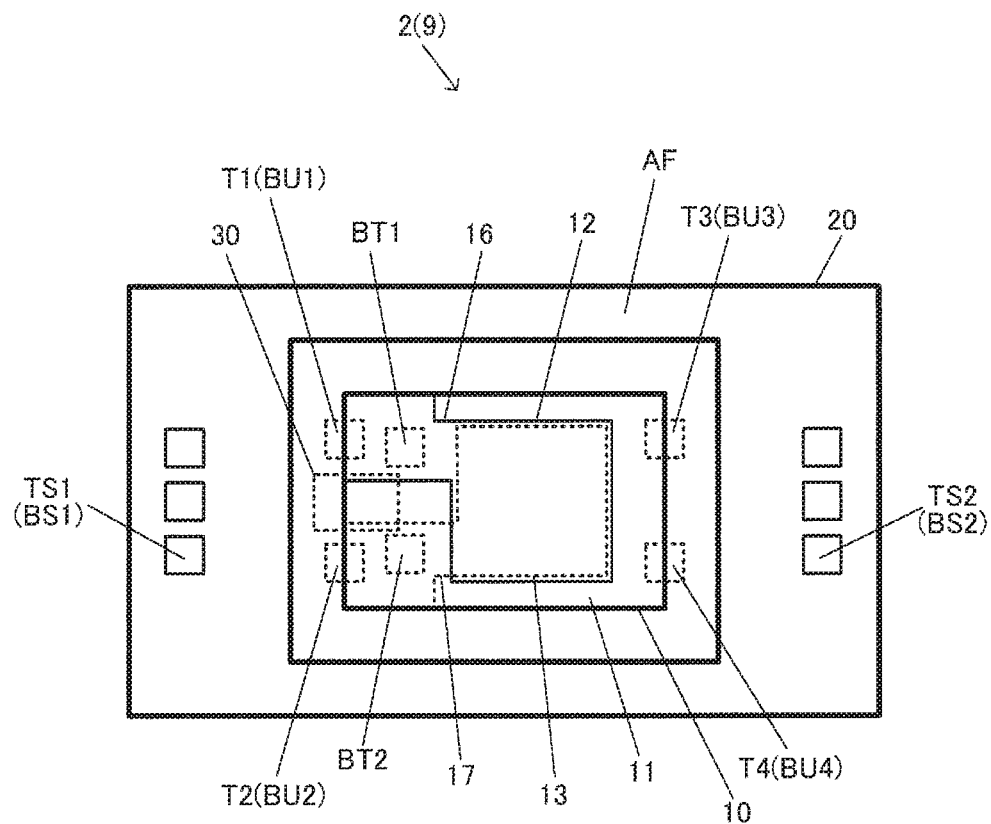
FIG. 7 is another plan view illustrating a configuration of the resonator device including the integrated circuit device and the resonator.
Figure 8:
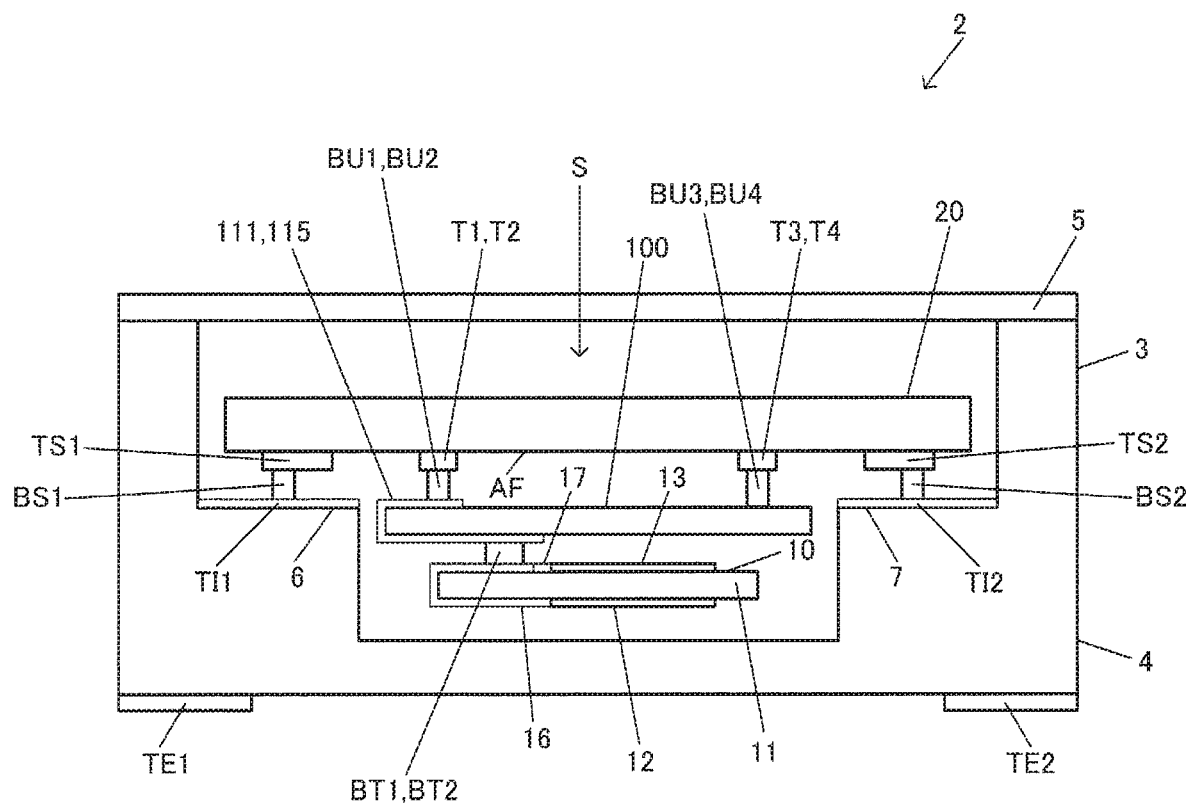
FIG. 8 is another sectional view illustrating a configuration of the resonator device including the integrated circuit device and the resonator.
Figure 8:
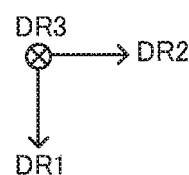

FIG. 7 is another descriptive diagram of the resonator device 2, and FIG. 8 is a sectional view illustrating the resonator device 2 in a state where the resonator device 2 is mounted on the package 3. In the resonator device 2 of the embodiment illustrated in FIG. 7, a relay substrate 100 is disposed between the resonator 10 and the integrated circuit device 20. For example, the resonator 10, the relay substrate 100, and the integrated circuit device 20 are attached to each other as a stack in their thickness direction. A unit in which the resonator 10, the relay substrate 100, and the integrated circuit device 20 are attached to each other as a stack is called the resonator unit 9 (stack body). Wiring 111 for electrically connecting the terminal T1 of the integrated circuit device 20 to the electrode 12 of the resonator 10 and wiring 115 for electrically connecting the terminal T2 of the integrated circuit device 20 to the electrode 13 of the resonator 10 are formed in the relay substrate 100. The wiring 111 and the wiring 115 are electrically connected to terminals of the resonator 10 through conductive bumps BT1 and BT2 that are disposed on the resonator 10 side surface of the relay substrate 100. The terminals of the resonator 10 are connected to the electrodes 12 and 13. Accordingly, the terminals T1 and T2 for driving the integrated circuit device 20 are electrically connected to the electrodes 12 and 13 of the resonator 10. The resonator 10 performs an oscillation operation by applying a drive voltage between the terminals T1 and T2. Accordingly, the relay substrate 100 is a substrate that relays electrical connection between the resonator 10 and the integrated circuit device 20.

The relay substrate 100 has a function of hindering transmission of stress caused by deformation of the integrated circuit device 20 or the package 3 to the resonator 10. For example, the relay substrate 100 can be implemented by a quartz crystal substrate. For example, the relay substrate 100 is formed by patterning the quartz crystal substrate by etching (for example, wet etching). The relay substrate 100 may be implemented by a piezoelectric substrate, a silicon substrate, a resin substrate, a metal substrate, a ceramic substrate, or the like other than the quartz crystal substrate. By interposing the relay substrate 100 between the resonator 10 and the integrated circuit device 20, deformation (stress) caused by heat distortion or the like of the integrated circuit device 20 or the package 3 is not easily transmitted to the resonator 10, and a decrease in the resonating characteristics of the resonator 10 can be reduced.

In addition, in the resonator device 2 in FIG. 7 and FIG. 8, the integrated circuit device 20 includes terminals T3 and T4 (third and fourth terminals) that are not electrically connected to the electrodes 12 and 13 (first and second electrodes) of the resonator 10. The resonator 10 is supported on the active surface AF side of the integrated circuit device 20 using conductive bumps BU1, BU2, BU3, and BU4 disposed in the terminals T1, T2, T3, and T4. Specifically, the resonator 10 is supported on the active surface AF side of the integrated circuit device 20 through the relay substrate 100 that is supported by the conductive bumps BU1, BU2, BU3, and BU4 of the terminals T1, T2, T3, and T4 of the integrated circuit device 20. As illustrated in FIG. 5 to FIG. 8, the number of terminals for supporting the resonator 10 or the relay substrate 100 may be three or may be four. Alternatively, the resonator 10 or the relay substrate 100 may be supported using five or more terminals.

Figure 9:
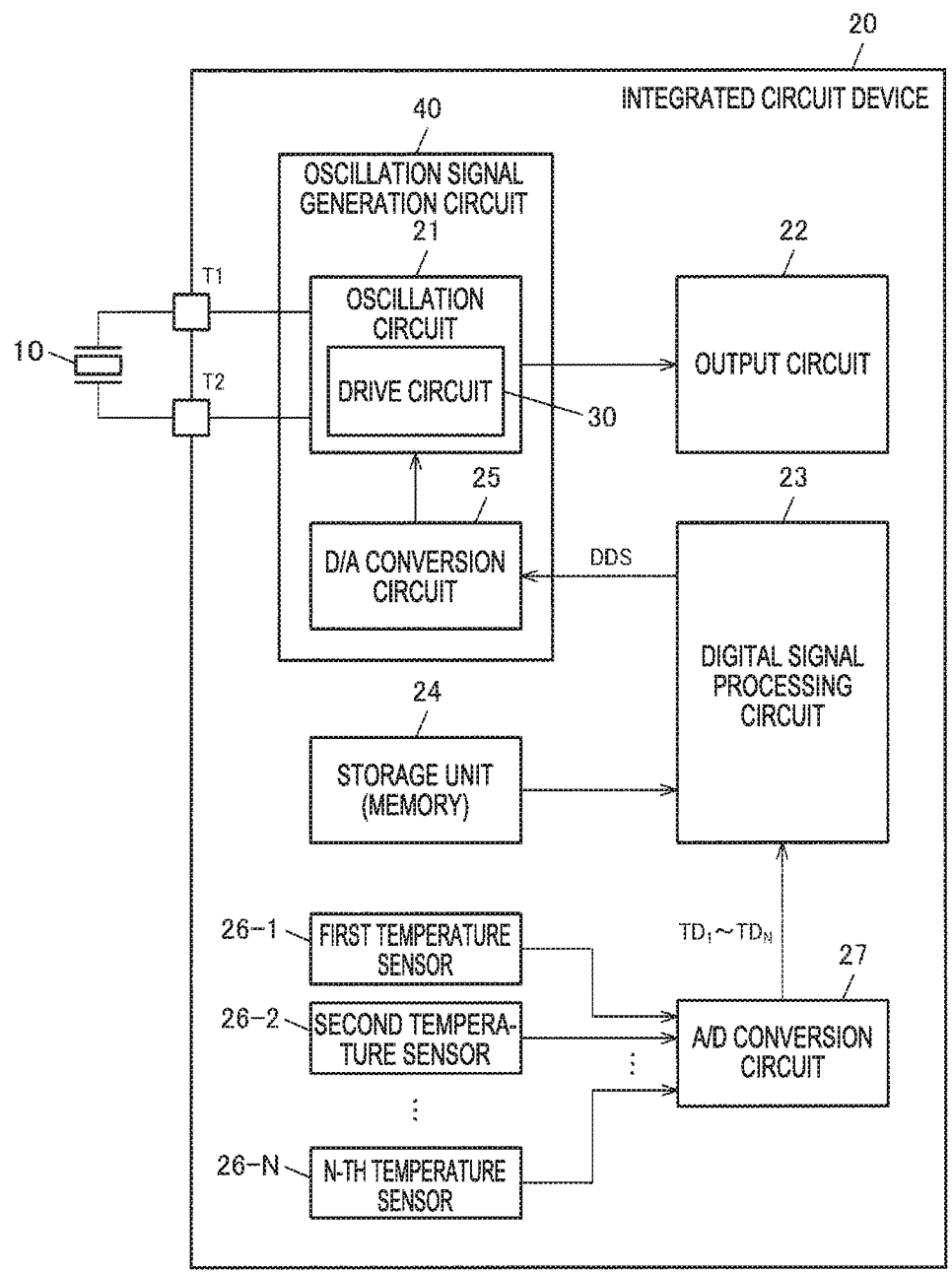
FIG. 9 is a configuration example of the integrated circuit device.

FIG. 9 illustrates a configuration example of the integrated circuit device 20. While an example in which the resonator device 2 is an oscillator is illustrated in FIG. 9, the resonator device 2 may be a physical quantity measurement device as will be described below using FIG. 23 and the like.

The integrated circuit device 20 includes an output circuit 22, the digital signal processing circuit 23, the storage unit 24 (memory), the temperature sensors 26, the A/D conversion circuit 27, and the oscillation signal generation circuit 40. In addition, the integrated circuit device 20 includes the terminals T1 and T2, corresponding to connection terminals. The integrated circuit device 20 is not limited to the configuration in FIG. 9. Various modifications can be made such that a part of the constituents is not included, or another constituent is added.

Each temperature sensor 26 (first to N-th temperature sensors 26-1 to 26-N) outputs a temperature-dependent voltage as the temperature detection voltage. The temperature-dependent voltage changes depending on the ambient (for example, the integrated circuit device 20 or the resonator 10) temperature. For example, each temperature sensor 26 generates the temperature-dependent voltage using a circuit element having temperature dependence and outputs the temperature-dependent voltage with a temperature-independent voltage (for example, a band gap reference voltage) as a reference. For example, a PN junction forward voltage is output as the temperature-dependent voltage.

The A/D conversion circuit 27 performs A/D conversion on the temperature detection voltage from the temperature sensors 26 and outputs the result of A/D conversion as the temperature detection data TD. For example, a successive comparison type, a flash type, a pipeline type, or a double integral type can be employed as an A/D conversion scheme.

The digital signal processing circuit 23 performs various types of signal processing. For example, the digital signal processing circuit 23 (temperature compensation unit) performs the temperature compensation process of compensating the temperature characteristics of the oscillation frequency of the resonator 10 based on the temperature detection data TD and outputs the frequency control data DDS for controlling the oscillation frequency. Details of the temperature compensation process will be described below.

The digital signal processing circuit 23 can be implemented by a digital signal processor (DSP) that executes various types of signal processing including the temperature compensation process in a time division manner. Alternatively, the digital signal processing circuit 23 may be implemented by an ASIC circuit such as a gate array based on automatic place and route or may be implemented by a processor (for example, a CPU or an MPU) and a program that operates on the processor. In addition, the digital signal processing circuit 23 may perform a correction process (for example, aging correction) other than temperature compensation. In addition, the digital signal processing circuit 23 may control a heater (open control) or the like of the constant temperature chamber in the constant temperature chamber type oscillator (OCXO).

The storage unit 24 stores various data including data for the temperature compensation process. The storage unit 24 may be implemented by a semiconductor memory such as a RAM (SRAM or DRAM) or may be implemented by a non-volatile memory.

The oscillation signal generation circuit 40 includes a D/A conversion circuit 25 and an oscillation circuit 21. The D/A conversion circuit 25 performs D/A conversion on the frequency control data DDS and outputs a control voltage corresponding to the frequency control data DDS to the oscillation circuit 21. The oscillation circuit is a circuit that includes the drive circuit 30 and oscillates the resonator 10 by driving the resonator 10 using the drive circuit 30. It is desirable to dispose a variable capacitance circuit for a connection node of at least one of an output node or an input node of the drive circuit 30. For example, the variable capacitance circuit is a varactor of which the capacitance value changes based on the control voltage from the D/A conversion circuit 25.

Figure 10:
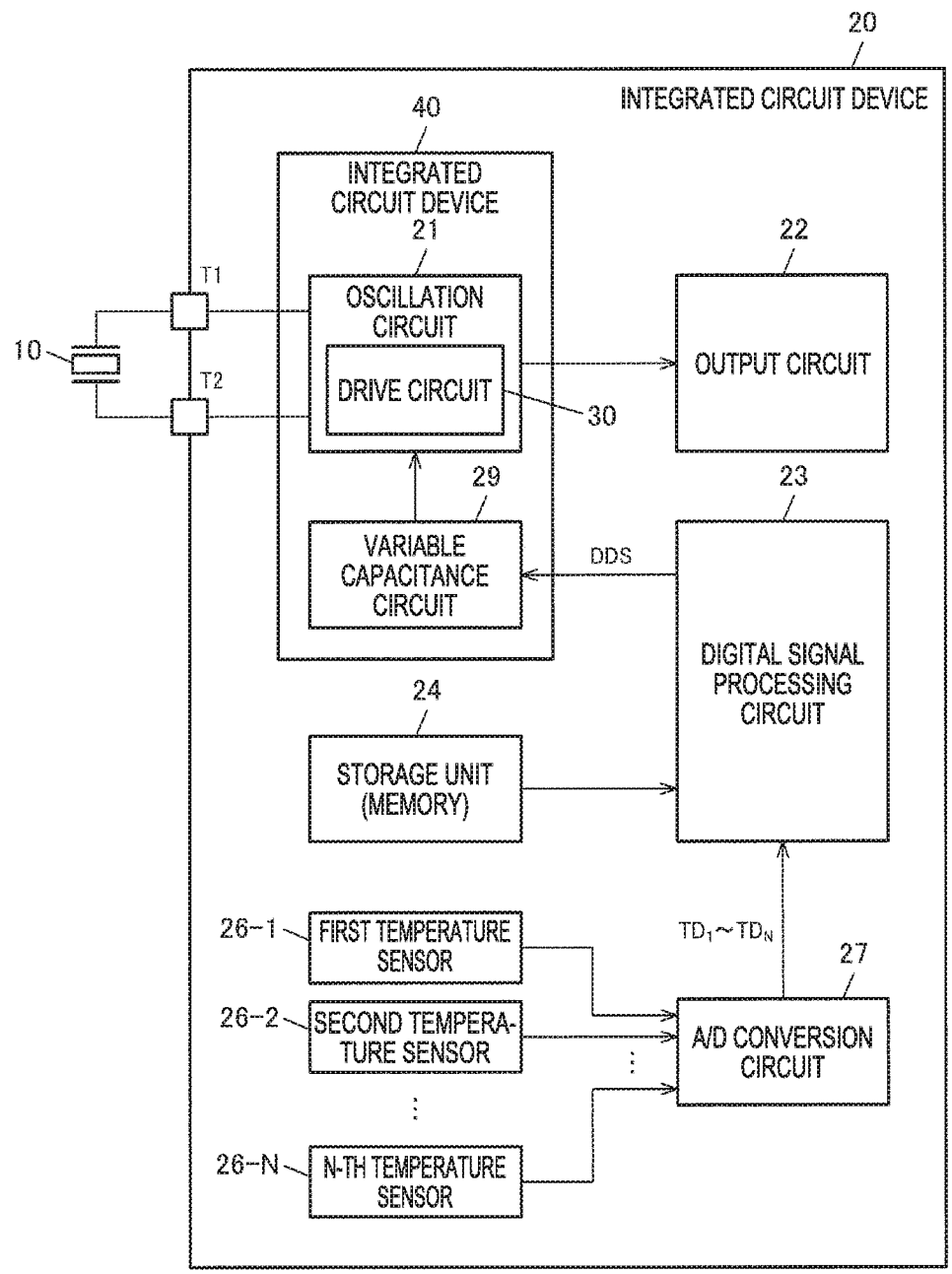
FIG. 10 is another configuration example of the integrated circuit device.

However, the oscillation signal generation circuit 40 may use other configurations. FIG. 10 is another configuration example of the integrated circuit device 20 (oscillation signal generation circuit 40). The oscillation signal generation circuit 40 of the integrated circuit device 20 in FIG. 10 includes a variable capacitance circuit and the oscillation circuit 21. The D/A conversion circuit 25 is not disposed in the oscillation signal generation circuit 40. The oscillation frequency of the oscillation signal generated by the oscillation signal generation circuit 40 in FIG. 10 is directly controlled based on the frequency control data DDS from the digital signal processing circuit 23. That is, the oscillation frequency of the oscillation signal is controlled without the D/A conversion circuit 25.

The capacitance value of the variable capacitance circuit 29 is controlled based on the frequency control data DDS from the digital signal processing circuit 23. For example, the variable capacitance circuit 29 includes a plurality of capacitors (capacitor array) and a plurality of switch elements (switch array) in which ON and OFF of each switch element is controlled based on the frequency control data DDS. Each switch element of the plurality of switch elements is electrically connected to each capacitor of the plurality of capacitors. By switching the plurality of switch elements ON or OFF, the number of capacitors of which one end is connected to one end of the resonator 10 among the plurality of capacitors is changed. Accordingly, the capacitance value of the variable capacitance circuit 29 is controlled, and the capacitance value at one end of the resonator 10 is changed. Accordingly, the capacitance value of the variable capacitance circuit 29 is directly controlled using the frequency control data DDS, and the oscillation frequency of the oscillation signal can be controlled.

The output circuit 22 (buffer circuit) performs buffering of the oscillation signal generated by the oscillation signal generation circuit 40 (oscillation circuit 21) and outputs a signal after buffering. That is, buffering for sufficiently driving an external load is performed. For example, the signal after buffering is a clipped sine wave signal. The signal may be a rectangular wave signal. Alternatively, the output circuit 22 may be a circuit that can output both of the clipped sine wave signal and the rectangular wave signal.

Next, the arrangement of the temperature sensors 26 in the integrated circuit device 20 will be described. As described above, in the integrated circuit device 20 (digital signal processing circuit 23) of the embodiment, the temperature of the temperature detection target device (resonator 10) is estimated. In order to increase the accuracy of temperature estimation based on the temperature detection data, the temperature sensor 26 is disposed in the vicinity of a heat conduction path between the integrated circuit device 20 and the resonator 10. Accordingly, the temperature detection data from the temperature sensors 26 is acquired as information that reflects heat conduction between the integrated circuit device 20 and the resonator 10. Thus, an improvement in the accuracy of temperature estimation can be expected.

Figure 11:
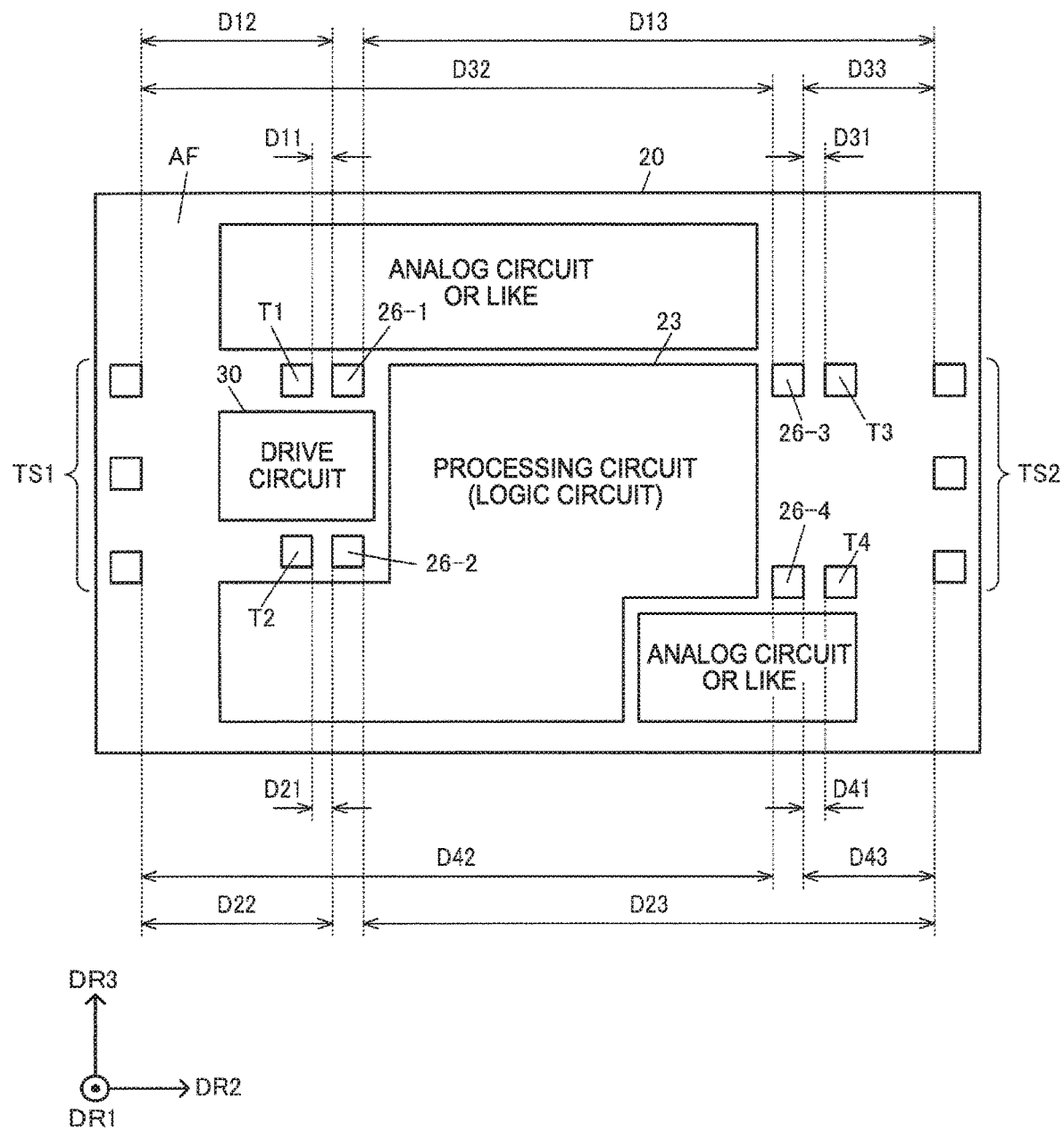
FIG. 11 is a diagram for describing the arrangement of temperature sensors.

FIG. 11 is a diagram for describing the arrangement of the temperature sensors 26. For example, the integrated circuit device 20 includes the connection terminal that is electrically connected to the temperature detection target device. In the case of the oscillator as an example, the connection terminal corresponds to a first oscillation terminal that is connected to one of the input node or the output node of the drive circuit 30, and a second oscillation terminal that is connected to the other of the input node or the output node of the drive circuit 30. The first oscillation terminal corresponds to the terminal T1, and the second oscillation terminal corresponds to the terminal T2, and T1 and T2 are connection terminals.

In addition, the integrated circuit device 20 includes a power supply terminal where a power supply voltage is supplied, and an output terminal from which a signal is output. In the case of the oscillator as an example, the signal output from the output terminal is the oscillation signal. In addition, the power supply terminal and the output terminal are terminals included in the terminal TS1 or TS2.

Figure 12:
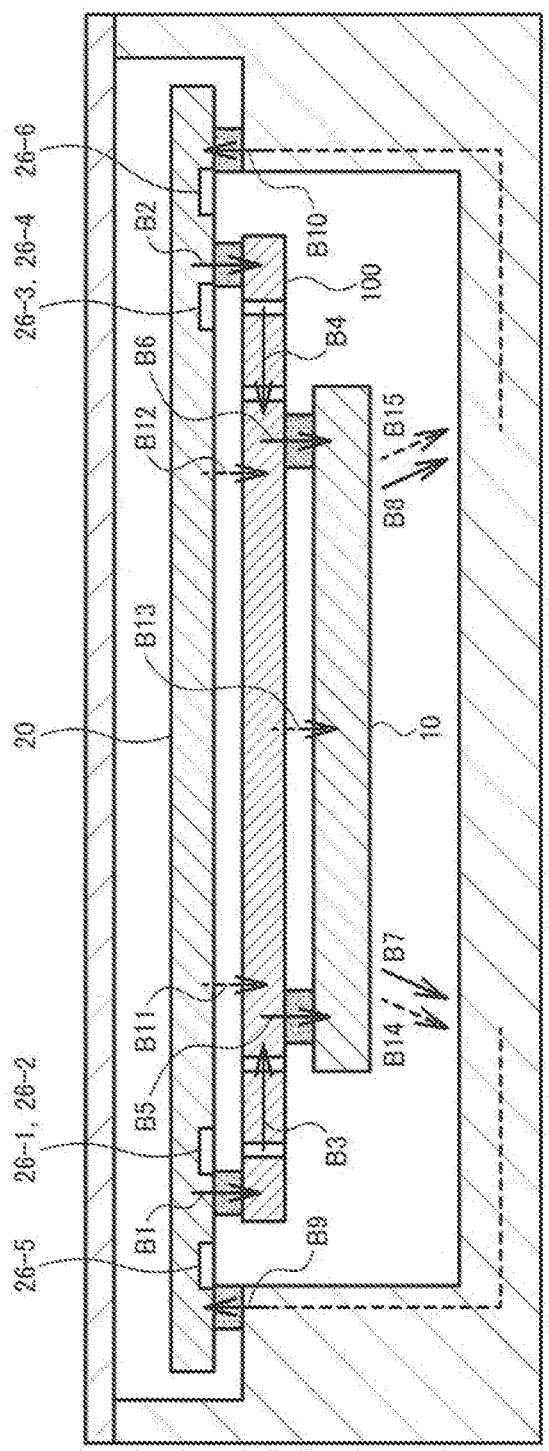
FIG. 12 is a diagram for describing a heat conduction path of the resonator device (oscillator).
Figure 12:
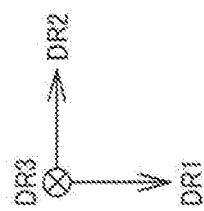

As illustrated in FIG. 11, the temperature sensor 26-1 included in the integrated circuit device 20 is arranged at a position closer to T1 than any terminal of TS1 or TS2. That is, a distance D11 between the temperature sensor 26-1 and the first oscillation terminal T1 is smaller than a distance D12 between the temperature sensor 26-1 and TS1 and a distance D13 between the temperature sensor 26-1 and TS2. In addition, the temperature sensor 26-2 is arranged at a position closer to T2 than any terminal of TS1 or TS2. That is, a distance D21 between the temperature sensor 26-2 and the second oscillation terminal T2 is smaller than a distance D22 between the temperature sensor 26-2 and TS1 and a distance D23 between the temperature sensor 26-2 and TS2. That is, in a case where at least one of the temperature sensors 26-1 and 26-2 is set as the first temperature sensor, the distance between the first temperature sensor and the first oscillation terminal is smaller than at least one of the distance between the first temperature sensor and the power supply terminal or the distance between the first temperature sensor and the output terminal. The distance between the first temperature sensor and the first oscillation terminal, the distance between the first temperature sensor and the power supply terminal, and the distance between the first temperature sensor and the output terminal refer to the shortest distance between the first temperature sensor and the first oscillation terminal, the shortest distance between the first temperature sensor and the power supply terminal, and the shortest distance between the first temperature sensor and the output terminal, respectively. FIG. 11 illustrates an example in which the distance between the temperature sensor 26-1 and the first oscillation terminal is smaller than any of the distance between the temperature sensor 26-1 and the output terminal or the distance between the temperature sensor 26-1 and the power supply terminal. Similarly, FIG. 12 illustrates an example in which the distance between the temperature sensor 26-2 and the second oscillation terminal is smaller than any of the distance between the temperature sensor 26-2 and the output terminal or the distance between the temperature sensor 26-2 and the power supply terminal.

As illustrated in FIG. 5 to FIGS. 8, T1 and T2 (BU1 and BU2) are members supporting the resonator 10 or the relay substrate 100 and constitute the heat conduction path between the integrated circuit device 20 and the resonator 10. Thus, by disposing the temperature sensors 26 (26-1 and 26-2) at a position relatively closer to T1 or a position closer to T2 with respect to other terminals (TS1 and TS2), high accuracy temperature estimation can be implemented. Particularly, since T1 and T2 are terminals necessary for driving the resonator 10, the likelihood that T1 and T2 constitute the heat conduction path is significantly high, and it is important to dispose the temperature sensors 26 in the vicinity of T1 and T2. While the embodiment is configured such that the distance between the temperature sensor 26-1 and the first oscillation terminal is smaller than any of the distance between the temperature sensor 26-1 and the output terminal or the distance between the temperature sensor 26-1 and the power supply terminal, the accuracy of the temperature compensation process can be improved as long as the distance between the temperature sensor 26-1 and the first oscillation terminal is smaller than one of the distance between the temperature sensor 26-1 and the output terminal or the distance between the temperature sensor 26-1 and the power supply terminal. The same applies to the temperature sensor 26-2.

In addition, the integrated circuit device 20 includes a support terminal. The support terminal is a terminal in which an electrode for support the relay substrate 100 is formed. Wiring that electrically connects the temperature detection target device and the integrated circuit device 20 is formed in the relay substrate 100. In this case, the support terminal corresponds to the terminals T3 and T4 in FIG. 7. In addition, the support terminal is a terminal in which an electrode for supporting the temperature detection target device is formed. In this case, the support terminal corresponds to the terminal T3 for supporting the resonator 10 in FIG. 5.

As illustrated in FIG. 11, a temperature sensor 26-3 is arranged at a position closer to T3 than any terminal of TS1 or TS2. That is, a distance D31 between the temperature sensor 26-3 and the support terminal T3 is smaller than a distance D32 between the temperature sensor 26-3 and TS1 and a distance D33 between the temperature sensor 26-3 and TS2. In addition, a temperature sensor 26-4 is arranged at a position closer to T4 than any terminal of TS1 or TS2. That is, a distance D41 between the temperature sensor 26-4 and the support terminal T3 is smaller than a distance D42 between the temperature sensor 26-4 and TS1 and a distance D43 between the temperature sensor 26-4 and TS2. That is, in a case where at least one of the temperature sensors 26-3 and 26-4 is set as the second temperature sensor, the distance between the second temperature sensor and the support terminal is smaller than at least one of the distance between the second temperature sensor and the power supply terminal or the distance between the second temperature sensor and the output terminal. The distance between the second temperature sensor and the support terminal, the distance between the second temperature sensor and the power supply terminal, and the distance between the second temperature sensor and the output terminal refer to the shortest distance between the second temperature sensor and the support terminal, the shortest distance between the second temperature sensor and the power supply terminal, and the shortest distance between the second temperature sensor and the output terminal, respectively.

While the terminals T3 and T4 are terminals that are not used in electrical connection, the terminals T3 and T4 support the resonator 10 or the relay substrate 100. Thus, since T3 and T4 also constitute the heat conduction path, the temperature sensors 26 may be disposed in the vicinity of T3 and T4. While the embodiment is configured such that the distance between the temperature sensor 26-3 and the support terminal is smaller than any of the distance between the temperature sensor 26-3 and the output terminal or the distance between the temperature sensor 26-3 and the power supply terminal, the accuracy of the temperature compensation process can be improved as long as the distance between the temperature sensor 26-3 and the support terminal is smaller than one of the distance between the temperature sensor 26-3 and the output terminal or the distance between the temperature sensor 26-3 and the power supply terminal. The same applies to the temperature sensor 26-4.

3. Temperature Estimation

Next, a process of estimating the temperature of the temperature detection target device (resonator 10) will be described in detail.

3.1 Heat Conduction Model

The digital signal processing circuit 23 performs a heat circuit simulation process using heat resistance information and heat capacitance information related to the heat conduction model based on the first to N-th temperature detection data TD1 to TDN and estimates the temperature of the temperature detection target device. The heat resistance information is information that specifies the position and the resistance value of a resistance in the heat conduction model (heat circuit). The heat capacitance information is information that specifies the position and the capacitance value of a capacitance in the heat conduction model (heat circuit).

FIG. 12 is a diagram for describing the heat conduction path of the resonator device 2 (oscillator). As described above using FIG. 7 and FIG. 8, the integrated circuit device 20 is supported by the package 3 using the terminals TS1 and TS2 (BS1 and BS2). In addition, the integrated circuit device 20 supports the relay substrate 100 using the terminals T1 to T4 (BU1 to BU4), and the relay substrate 100 supports the resonator 10 in BT1 and BT2.

In FIG. 12, a heat conduction path is illustrated by B1 to B10, and a heat emission (radiation) path is illustrated by B11 to B15. As illustrated in FIG. 12, terminals that are used for connection constitute a main heat conduction path among the package 3, the integrated circuit device 20, the relay substrate 100, and the resonator 10. As described above using FIG. 11, the temperature sensors 26 (26-1 to 26-4) are disposed in the vicinity of the terminals T1 to T4. In addition, another temperature sensor 26 not illustrated in FIG. 11 may be added. FIG. 12 illustrates an example in which the temperature sensors 26 (26-5 and 26-6) are disposed in the vicinity of the heat conduction path between the package 3 and the integrated circuit device 20.

FIG. 13 is an example of a heat conduction model (heat circuit) corresponding to FIG. 12. It is known that heat conduction can be modeled as a heat circuit that includes heat resistances and heat capacitances. In FIG. 13, C1 to C6 are nodes corresponding to the temperature sensors 26-1 to 26-6, respectively, and the temperature detection data TD of each temperature sensor 26 corresponds to the electric potential of the node. In addition, C7 and C8 are nodes on the resonator 10, and the electric potential of C7 or C8 corresponds to the temperature (temperature estimation value) of the resonator 10.

The unit heat capacitance and the unit heat resistance are determined depending on substances. Thus, the resistance value of each heat resistance (RT1 to RT28) and the capacitance value of each heat capacitance (CT1 to CT8) in the circuit in FIG. 13 are determined based on a specific structure (the material, the length, the sectional area, and the like of each member) of the oscillator. In the example in FIG. 13, RT1 to RT8 are heat resistances of which the resistance values are determined by the characteristics of the integrated circuit device 20. In addition, RT9 to RT12 are heat resistances of which the resistance values are determined by the characteristics of the connection part between the integrated circuit device 20 and the relay substrate 100. The same applies to the other heat resistances. RT13 to RT18 correspond to the relay substrate 100. RT19 and RT20 correspond to the connection part between the relay substrate 100 and the resonator 10. RT21 is a heat resistance corresponding to the resonator 10. RT22 to RT25 correspond to the connection part or heat radiation between the integrated circuit device 20 and the package 3. RT26 and RT27 correspond to the part between the package 3 and the outside. RT28 is a heat resistance corresponding to the package 3. In addition, CT1 and CT2 are heat capacitances corresponding to the integrated circuit device 20. CT3 and CT4 are heat capacitances corresponding to the relay substrate 100. CT5 and CT6 are heat capacitances corresponding to the resonator 10. CT7 and CT8 are heat capacitances corresponding to the package 3.

By determining the electric potential of each node of C1 to C6 based on the temperature detection data TD (TD1 to TD6) and performing a circuit simulation process (heat circuit simulation process), the electric potential of C7 or C8, that is, the temperature estimation value, can be obtained.

However, in a case where a complex heat conduction model (heat circuit) is used, the process load of the circuit simulation process is high. It is considered that executing the circuit simulation process in the digital signal processing circuit 23 during the operation of the integrated circuit device 20 (oscillator) is difficult depending on the performance of the digital signal processing circuit 23 (DSP). Thus, the digital signal processing circuit 23 of the embodiment may obtain the temperature estimation value using a relatively simple heat conduction model.

Figure 14:
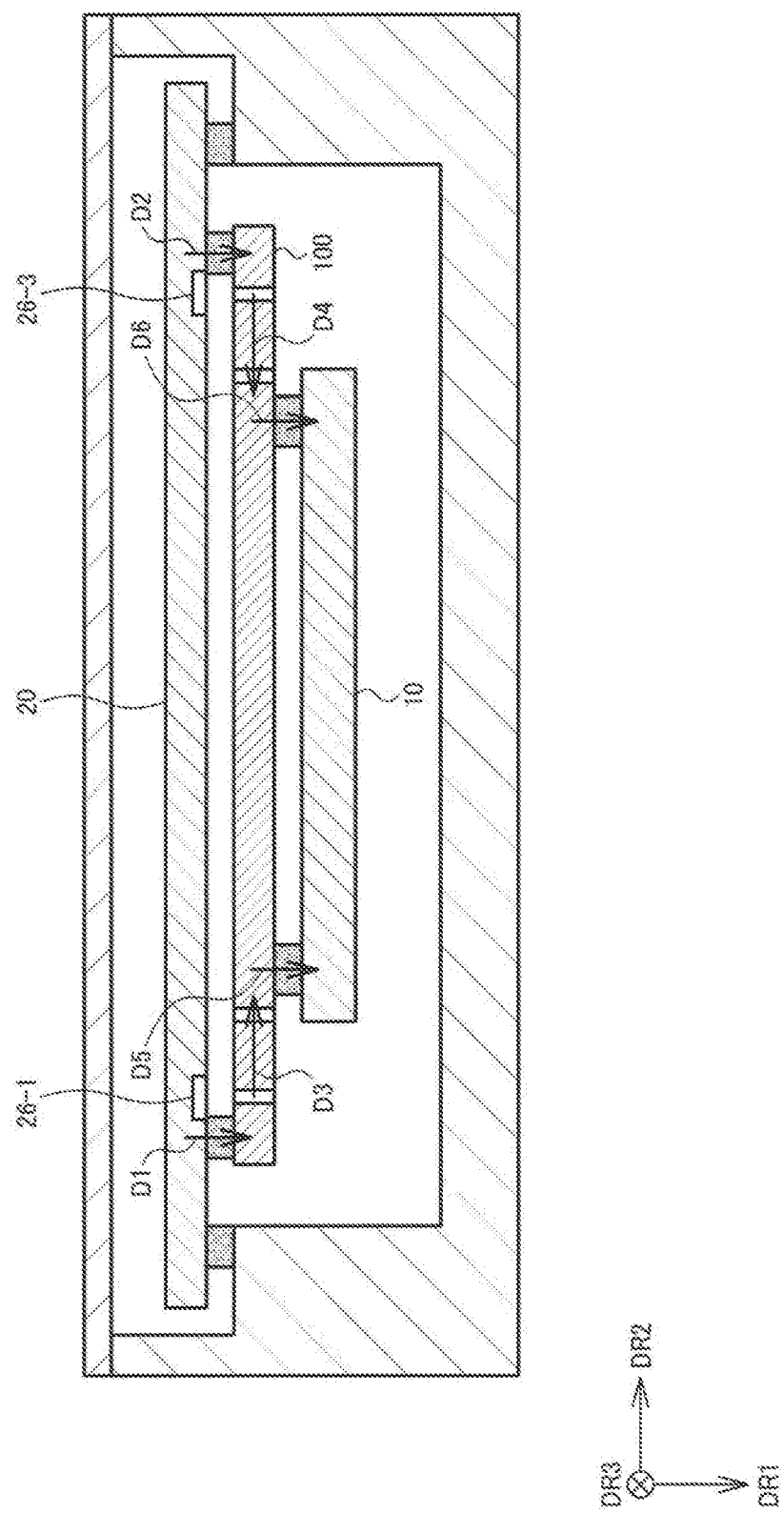
FIG. 14 is another diagram for describing the heat conduction path of the resonator device (oscillator).

FIG. 14 is a diagram for describing the heat conduction path of the resonator device 2 (oscillator). In FIG. 14, the temperature sensors on the integrated circuit device 20 are limited to two temperature sensors 26-1 and 26-3, and heat conduction paths are limited to D1 to D6 (correspond to B1 to B6 in FIG. 12).

Figure 15:
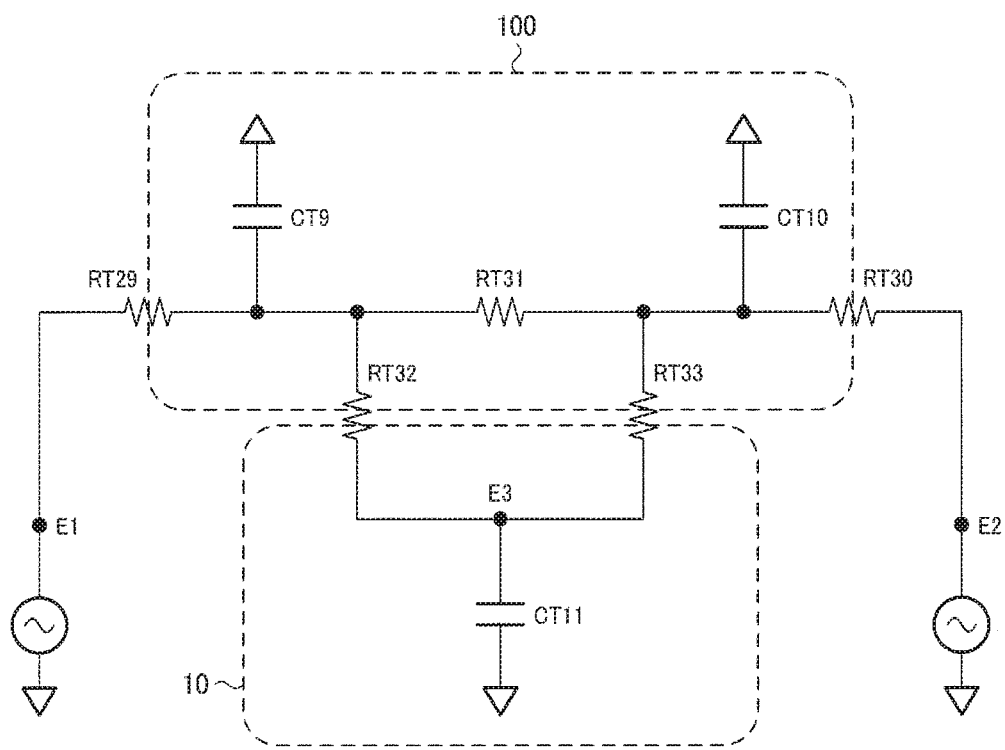
FIG. 15 is an example of the heat conduction model of the resonator device (oscillator).

FIG. 15 is an example of a heat conduction model (heat circuit) corresponding to FIG. 14. In FIG. 15, the electric potentials of two nodes E1 and E2 that are connected to a given heat source (current source) correspond to the temperatures of the temperature sensors 26-1 and 26-3, respectively. E3 is a node on the resonator 10, and the electric potential of E3 corresponds to the temperature (temperature estimation value) of the resonator 10. RT29 and RT30 are heat resistances of which the resistance values are determined by the characteristics of the connection part between the integrated circuit device 20 and the relay substrate 100. RT31 is a heat resistance corresponding to the relay substrate 100, and RT32 and RT33 are heat resistances corresponding to the connection part between the relay substrate 100 and the resonator 10. CT9 and CT10 are heat capacitances corresponding to the relay substrate 100, and CT11 is a heat capacitance corresponding to the resonator 10.

Figure 16:
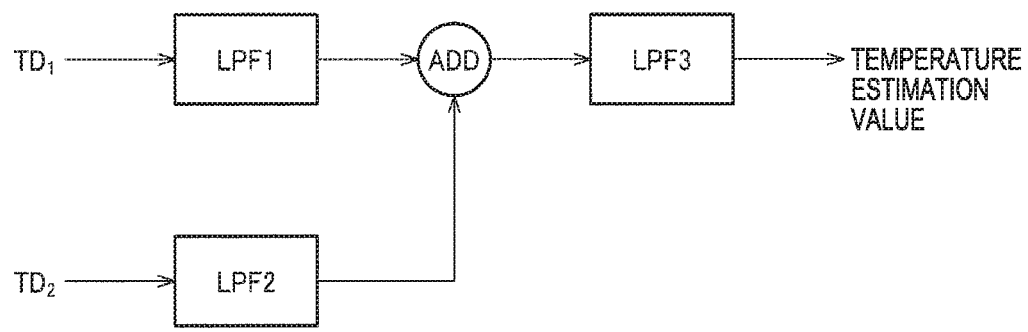
FIG. 16 is an example in which the heat conduction model of the resonator device (oscillator) is approximated by a low pass filter.

The heat circuit illustrated in FIG. 15 can be approximated to a model that is broadly configured with three LPFs and an addition circuit. FIG. 16 is a configuration example in a case where FIG. 15 is approximated. The heat conduction model includes first to third low pass filters (LPF1 to LPF3) and an addition circuit ADD. The temperature detection data (TD1) based on the temperature sensor 26-1 is input into LPF1. The temperature detection data (TD2) based on the temperature sensor 26-3 is input into LPF2. The addition circuit ADD adds the output of LPF1 and the output of LPF2. The output (addition result) of the addition circuit ADD is input into LPF3. The output of LPF3 is a signal corresponding to the electric potential of E1, that is, the temperature estimation value.

In the configuration illustrated in FIG. 16, calculation of the temperature estimation value can be performed from the temperature detection data by easy calculation of a filter process (low pass filter process) and an addition process, and is easily executed in the digital signal processing circuit 23.

Figure 17:
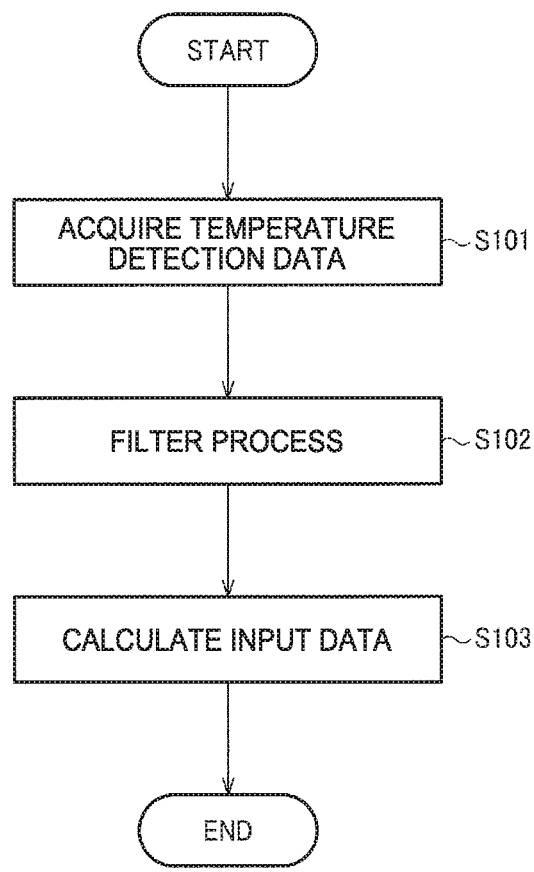
FIG. 17 is a flowchart for describing a process of estimating the temperature of a temperature detection target device.

FIG. 17 is a flowchart for describing the temperature estimation process executed by the integrated circuit device 20 (digital signal processing circuit 23) according to the embodiment. In a case where the process is started, the digital signal processing circuit 23 acquires the first to N-th temperature detection data TD1 to TDN from the first to N-th temperature sensors 26 (S101) and performs a noise reduction filter process (S102). Modifications can be made such that the filter process is not performed, or another noise reduction process is performed.

Next, the digital signal processing circuit 23 calculates the temperature estimation value by performing the heat circuit simulation process based on the heat conduction model (heat circuit) and the first to N-th temperature detection data TD1 to TDN (S103).

The obtained temperature estimation value can be used in various processes. In a case where the resonator device 2 is an oscillator, the temperature compensation process that reduces fluctuation of the oscillation frequency accompanied by a change in temperature is performed based on the temperature estimation value. The temperature compensation process may be performed using polynomial approximation or may be performed using neural network calculation that takes the temperature estimation value as input.

For example, a change in time of the temperature estimation value corresponding to the temperature sweep is obtained based on the temperature detection data actually measured by the temperature sweep in the inspection step and the heat conduction model in FIG. 13. Furthermore, in the inspection step, a change in time of the frequency of the oscillation signal is actually measured, and the frequency control data DDS for outputting the oscillation signal of a desired frequency is obtained based on the actually measured data. Accordingly, since the relationship between the temperature estimation value and the frequency control data DDS can be obtained, the coefficient of the polynomial that approximates the relationship is obtained by the least squares method or the like and is stored in the storage unit 24. The digital signal processing circuit 23 obtains the temperature estimation value by the circuit simulation process based on the first to N-th temperature detection data TD1 to TDN (FIG. 17 described above) and calculates the frequency control data DDS by polynomial approximation that takes the temperature estimation value as input (variable).

In a case where the temperature compensation process is performed by the neural network calculation, the relationship between the temperature estimation value and the frequency control data DDS is obtained in the same manner based on the actual measurement data in the inspection step. In the learning process, the weight and the bias are determined using backpropagation or the like, described below, with the frequency control data DDS for the temperature estimation value as training data. The determined weight and the determined bias are stored in the storage unit 24. The digital signal processing circuit 23 obtains the temperature estimation value by the circuit simulation process based on the first to N-th temperature detection data TD1 to TDN and calculates the frequency control data DDS by the neural network calculation that takes the temperature estimation value as input. The accuracy of the neural network calculation may be improved by including not only the temperature estimation value but also the repeatedly multiplied temperature estimation value as input.

In addition, the polynomial approximation may be combined with the neural network calculation. Specifically, a brief temperature compensation process is performed based on polynomial approximation, and an error that cannot be compensated by polynomial approximation is compensated by the neural network calculation. By doing so, a high accuracy temperature compensation process can be performed even with a neural network having a relatively small number of neurons. Thus, the amount of data stored in the storage unit 24 can be reduced.

3.2 Neural Network Calculation

As described above, the circuit simulation process has a high process load. Thus, execution of the circuit simulation process in the digital signal processing circuit 23 (DSP) of the integrated circuit device 20 is difficult. Particularly, in a case where a relatively complex heat conduction model illustrated in FIG. 13 is used, the load of the circuit simulation process is increased, and implementation of the circuit simulation process in the DSP is difficult. Thus, the learning process of the neural network using the heat conduction model may be executed in advance by another information processing apparatus (PC or the like), and the digital signal processing circuit 23 of the integrated circuit device 20 may directly obtain the temperature estimation value or the frequency control data DDS by performing the neural network calculation using the parameters after learning.

3.2.1 Outline of Neural Network Calculation

FIG. 18 is a basic structure example of the neural network. The neural network is a mathematical model that simulates brain functions on a computer. One circle (node) in FIG. 18 is called a neuron. In the example in FIG. 18, the neural network includes an input layer (I), two hidden layers (HH1 and H2), and an output layer (O). The number of neurons in the input layer is three. The number of neurons in each hidden layer is four. The number of neurons in the output layer is one. Various modifications can be made to the number of hidden layers (intermediate layers) or the number of neurons included in each layer. Each neuron included in the input layer is coupled to the neurons in the first hidden layer (H1).

The neurons included in the first hidden layer are coupled to the neurons in the second hidden layer (H2), and the neurons included in the second hidden layer are coupled to the neuron in the output layer.

The input layer includes neurons, each of which outputs an input value. In the example in FIG. 18, the neural network receives x1, x2, and x3 as input and the neurons in the input layer output x1, x2, and x3, respectively. Any type of preprocessing may be performed on the input value, and each neuron in the input layer may output the value after preprocessing.

In each neuron from the hidden layers (intermediate layers), calculation that imitates a state where information as an electric signal is transmitted in a brain is performed. In the brain, the transmittability of information changes depending on the coupling strength between synapses. Thus, the coupling strength is denoted by a weight W in the neural network.

In FIG. 18, W1 is the weight between the input layer and the first hidden layer. W1 denotes a set of weights between a given neuron included in the input layer and a given neuron included in the first hidden layer. In a case where the weight between a p-th neuron in the input layer and a q-th neuron in the first hidden layer is denoted by w1$pq$, W1 in FIG. 18 is information that includes 12 weights of w111 to w134. In a wider sense, the weight W1 is information that includes the number of weights corresponding to the product of the number of neurons in the input layer and the number of neurons in the first hidden layer.

In the first neuron in the first hidden layer, calculation illustrated in Expression (1) is performed. That is, in one neuron, a multiply-accumulate calculation is performed on the outputs of the neurons in the immediately previous layer connected to the neuron, and calculation of adding a bias (b1) is performed.

$$h_1 = f\left(\sum_i w^1_{j1} \cdot x_i + b_1\right) \qquad (1)$$

In addition, as illustrated in Expression (1), in the calculation in one neuron, an activation function f that is a non-linear function is used. For example, the activation function f uses a ReLU function illustrated in Expression (2). The ReLU function is a function of which the value is equal to zero in a case where a variable is smaller than or equal to zero, and is equal to the variable in a case where the variable is greater than zero. It is known that various functions can be used as the activation function f. A sigmoid function may be used, or a function acquired by improving the ReLU function may be used. While a calculation expression for h1 is illustrated in Expression (1), the same calculation may be performed in other neurons in the first hidden layer.

$$f(x) = \max(0, x) = \begin{cases} 0 & (x \leq 0) \\ x & (x \geq 0) \end{cases} \qquad (2)$$

In addition, the same applies to the subsequent layers. For example, in a case where the weight between the first hidden layer and the second hidden layer is denoted by W2, a multiply-accumulate calculation that uses the output of the first hidden layer and the weight W2, and calculation of adding a bias and applying the activation function are performed in the neurons in the second hidden layer.

In the neuron in the output layer, calculation of weighting and adding the output of the immediately previous layer (in the example in FIG. 18, the second hidden layer) and adding a bias is performed. In the neural network, the result of the calculation in the output layer is the output of the neural network. Alternatively, the result of any type of postprocessing performed on the result of the calculation in the output layer may be output.

As is understood from the above description, an appropriate weight and an appropriate bias need to be set (learned) in order to acquire a desired output from the input. In the learning, multiple sets of a given input x and a correct output t (training data) of the input are prepared. The learning process of the neural network can be considered as a process of obtaining the most reliable weight and the most reliable bias for the multiple training data. Backpropagation is widely known as the learning process of the neural network.

Figure 19:
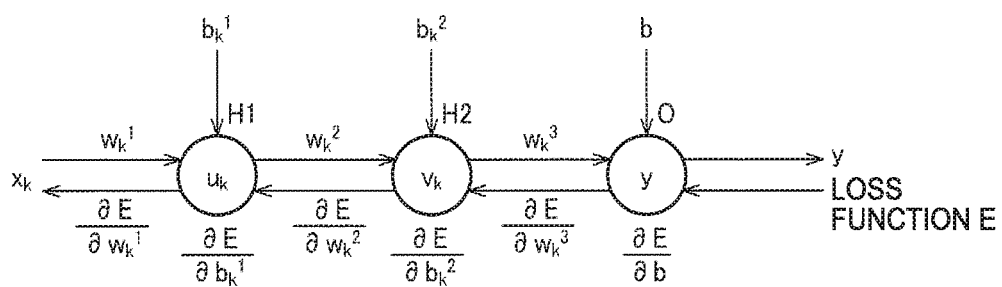
FIG. 19 is a descriptive diagram of backpropagation.

FIG. 19 is a diagram for describing the backpropagation. In FIG. 19, a process that is focused on one neuron in each of the first hidden layer, the second hidden layer, and the output layer is illustrated for simplification of description. In the backpropagation, parameters (the weight and the bias) are updated by repeating a forward pass and a backward pass. First, an output y is calculated using the input x and the weight and the bias at that point of time. The initial values of the weight and the bias can be set in various manners. In the example in FIG. 19, calculation in Expressions (3) to (5) is performed, and y is calculated from xk. In Expressions (3) to (5), u denotes the output of the first hidden layer, and v denotes the output of the second hidden layer.

$$y = \sum_{k=1}^{n} (w_k^3 \cdot v_k) + b \tag{3}$$

$$v = f\left(\sum_{k=1}^{n} (w_k^2 \cdot u_k) + b^2\right) \tag{4}$$

$$u = f\left(\sum_{k=1}^{n} (w_k^1 \cdot x_k) + b^1\right) \tag{5}$$

A loss function E is obtained based on the obtained output y and training data t corresponding to the input x. For example, the loss function E is in Expression (6). The loss function E may be a simple difference (y−t), or other loss functions may be used. A process performed up to the obtaining of the loss function E is called a forward pass.

$$E = \tfrac{1}{2}(y-t)^2 \tag{6}$$

After the loss function E is obtained by the forward pass, each parameter is updated using a partial derivative of the loss function E as illustrated in Expressions (7) to (12). In Expressions (7) to (12), a value that is suffixed with "+1" denotes a value after the update process. For example, b+1 denotes the value of b after the update process. In addition, η denotes a learning rate. It is desirable that the learning rate is not constant and is changed depending on the status of learning.

$$b_{+1} = b - \eta \frac{\partial E}{\partial b} \tag{7}$$

$$w_{k+1}^3 = w_k^3 - \eta \frac{\partial E}{\partial w_k^3} \tag{8}$$

$$b_{k+1}^2 = b_k^2 - \eta \frac{\partial E}{\partial b_k^2} \tag{9}$$

$$w_{k+1}^2 = w_k^2 - \eta \frac{\partial E}{\partial w_k^2} \tag{10}$$

$$b_{k+1}^1 = b_k^1 - \eta \frac{\partial E}{\partial b_k^1} \tag{11}$$

$$w_{k+1}^1 = w_k^1 - \eta \frac{\partial E}{\partial w_k^1} \tag{12}$$

At this point, the partial derivative of the loss function E related to each parameter is calculated from the output layer toward the input layer using a chain rule. Specifically, each partial derivative illustrated in Expressions (7) to (12) can be easily obtained by sequentially calculating Expressions (13) to (18). In addition, in a case where the ReLU function in Expression (2) is used as the activation function f, the derivative value is either zero or one. Thus, the partial derivative is easily calculated. A series of processes that use Expressions (7) to (18) is called a backward pass.

$$\frac{\partial E}{\partial b} = \frac{\partial E}{\partial y} \cdot \frac{\partial y}{\partial b} = (y-t) \tag{13}$$

$$\frac{\partial E}{\partial w_k^3} = \frac{\partial E}{\partial y} \cdot \frac{\partial y}{\partial w_k^3} = (y-t) \cdot v_k \tag{14}$$

$$\frac{\partial E}{\partial b_k^2} = \frac{\partial E}{\partial y} \cdot \frac{\partial y}{\partial v_k} \cdot \frac{\partial v_k}{\partial b_k^2} = (y-t) \cdot w_k^3 \cdot f'(v_k) \tag{15}$$

$$\frac{\partial E}{\partial w_k^2} = \frac{\partial E}{\partial y} \cdot \frac{\partial y}{\partial v_k} \cdot \frac{\partial v_k}{\partial w_k^2} = (y-t) \cdot w_k^3 \cdot f'(v_k) \cdot u_k \tag{16}$$

$$\frac{\partial E}{\partial b_k^1} = \frac{\partial E}{\partial y} \cdot \frac{\partial y}{\partial v_k} \cdot \frac{\partial v_k}{\partial u_k} \cdot \frac{\partial u_k}{\partial b_k^1} = (y-t) \cdot w_k^3 \cdot f'(v_k) \cdot w_k^2 \cdot f'(u_k) \tag{17}$$

$$\frac{\partial E}{\partial w_k^1} = \frac{\partial E}{\partial y} \cdot \frac{\partial y}{\partial v_k} \cdot \frac{\partial v_k}{\partial u_k} \cdot \frac{\partial u_k}{\partial w_k^1} = (y-t) \cdot w_k^3 \cdot f'(v_k) \cdot w_k^2 \cdot f'(u_k) \cdot x_k \tag{18}$$

In the learning process, the forward pass and the backward pass are repeatedly executed until it is determined that the parameters converge.

3.2.2 Neural Network Calculation of Embodiment

However, due to the effect of heat conduction described above using FIG. 3 and FIG. 4, it may be difficult to perform temperature estimation with high accuracy using only the temperature detection data of a single temperature sensor 26 as the input of the neural network. Thus, in the embodiment, the temperature estimation value or the frequency control data DDS is directly obtained using the neural network that takes the temperature detection data TD1 to TDN from the first to N-th temperature sensors 26 and the amount of change in time of the temperature detection data TD as input.

Specifically, in a case where the temperature detection data of the first to N-th temperature sensors 26 are denoted by TD1 to TDN, input candidates are the amount of change in time of the temperature detection data and the repeatedly multiplied temperature detection data. In the case of the temperature detection data TD1 of the first temperature sensor 26 (26-1), the input candidates are not only TD1 but also TD1^2, TD1^3, . . . TD1^M, and ΔTD1. The amount of change in time of TD1 is denoted by ΔTD1. For example, ΔTD1 is the difference in value between TD1 at a given timing (the most recent timing) and TD1 at a timing in the past (the immediately previous timing). Similarly, in the case of the i-th temperature detection data TDi, the input candidates are TDi, TDi^2, . . . , TDi^M, and ΔTDi. That is, in the embodiment, M+1 pieces of data can be used as input for one temperature sensor 26, and total N×(M+1) pieces of data can be used as input.

While N is, for example, approximately six, and M is, for example, approximately five, various modifications can be made to the number of temperature sensors 26 or the upper limit value of the exponent. In addition, the amount of change in time is not limited to the difference in value between the most recent two timings. The difference between the most recent timing and the second previous or earlier timing may be set as the amount of change in time. The average value or the like of a plurality of differences in value may be set as the amount of change in time. The result of a filter process performed on the difference in value may be set as the amount of change in time. In addition, the number of amounts of change in time set as the input candidates is not limited to one. A plurality of amount of change in time may be set as the input candidates among the above various amounts of change in time.

The digital signal processing circuit 23 of the embodiment estimates the temperature of the temperature detection target device or generates the frequency control data by the neural network calculation based on the first to N-th temperature detection data TD1 to TDN. More specifically, the digital signal processing circuit 23 estimates the temperature of the temperature detection target device or generates the frequency control data for correcting the temperature characteristics of the temperature detection target device by the neural network calculation process based on the amount of change in time of the i-th temperature detection data TDi among the first to N-th temperature detection data TD1 to TDN. Accordingly, the input of the neural network can be appropriately set. Thus, the temperature characteristics of the temperature detection target device can be subjected to temperature compensation with high accuracy.

In the neural network calculation of the digital signal processing circuit 23, all of the input candidates may be used as input. However, in a case where the number of inputs is increased, the number of pieces of data included in the weight W1 between the input layer and the first hidden layer is increased. Thus, the amount of data stored in the storage unit 24 is increased. Thus, a part of the input candidates may be used as the input of the neural network. Hereinafter, data that is selected as the input of the neural network among the input candidates will be referred to as input data Xin. In order to improve the accuracy of the temperature compensation process, it is necessary to satisfy at least one of inclusion of data based on two or more pieces of temperature detection data in the input data Xin, or inclusion of one or more amounts of change in time in the input data Xin. Considering accuracy, it is desirable to satisfy both conditions.

The learning process of the neural network in the embodiment will be described. First, in the inspection step, a temperature sweep is performed in the constant temperature chamber, and actual measurement data is acquired. For example, the temperature sweep is performed within a range of −40° C. to 125° C. as illustrated in FIG. 2.

Figure 20:
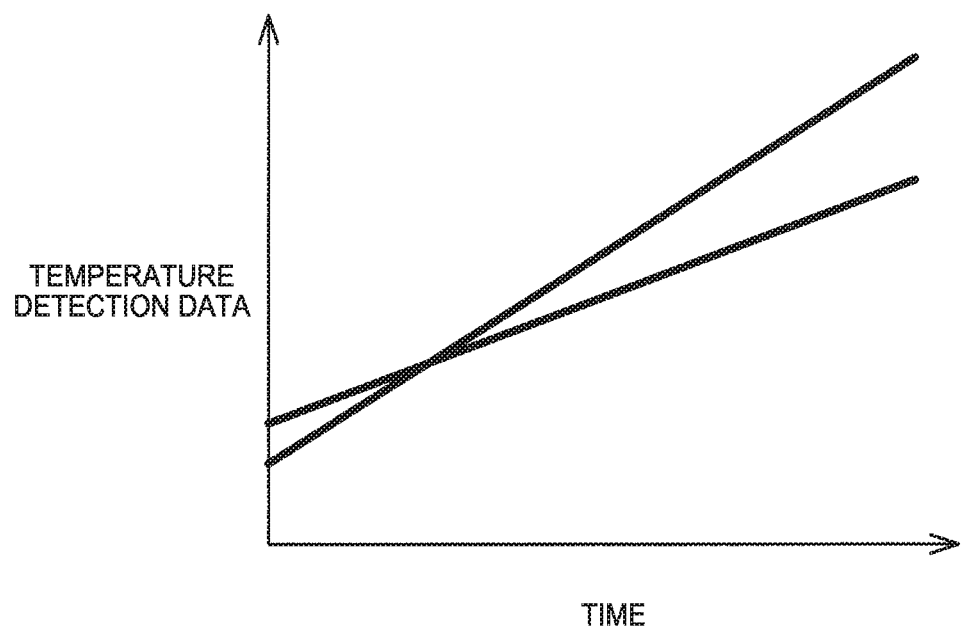
FIG. 20 is an example of change in time of temperature detection data measured in the inspection step.

FIG. 20 is a graph representing a change in time of the temperature detection data TD1 to TDN of the first to N-th temperature sensors 26 actually measured in the inspection step. In FIG. 20, a horizontal axis denotes time, and a vertical axis denotes the value of the temperature detection data. FIG. 20 illustrates two pieces of temperature detection data for simplification of description.

Figure 21:
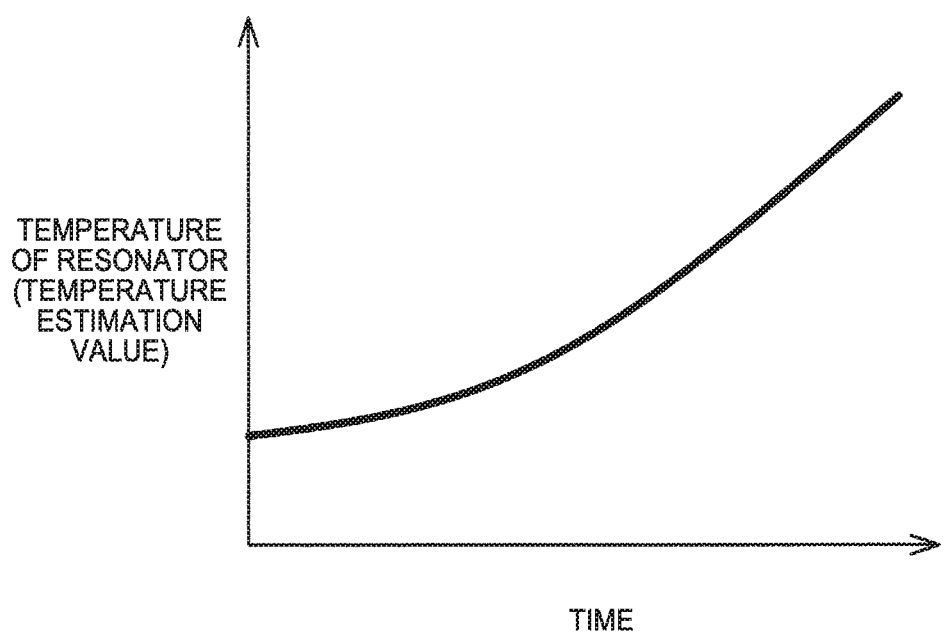
FIG. 21 is an example of change in time of a temperature estimation value estimated from actual measurement data and the heat conduction model.

After the temperature detection data TD1 to TDN are actually measured by the temperature sweep, a change in time of the temperature estimation value is obtained as illustrated in FIG. 21 by the circuit simulation process using the temperature detection data TD1 to TDN (FIG. 20) and the heat conduction model. The heat conduction model used in calculation of the temperature estimation value may be a relatively complex model illustrated in FIG. 13 or may be a relatively simple model illustrated in FIG. 15 or FIG. 16. However, considering the fact that an external information processing apparatus can be used in the learning process, and the problem of a high processing load does not arise, using a relatively complex heat conduction model is advantageous in terms of accuracy.

As described above, the mutual relationship among the input data Xin, the temperature estimation value, and correction target data can be obtained using the temperature detection data and the correction target data (in the case of an oscillator, the oscillation frequency; in the case of a gyrosensor, the zero point output actually measured in the inspection step and a calculation process (calculation of repeated multiplication and the amount of change in time, and the circuit simulation process) based on the data.

In the embodiment, in a case where the temperature estimation value is output by the neural network calculation, the temperature estimation value corresponding to the input data Xin is used as training data for the learning process. In addition, as another embodiment, in a case where the temperature compensation process is performed by the neural network calculation, the correction target data corresponding to the input data Xin is used as training data for the learning process. In the learning process, the accuracy of learning can be increased by preparing multiple pieces of training data. Thus, a plurality of pieces of learning data may be extracted from data that is acquired in one temperature sweep. In addition, considering heat conduction, the temperature sweep may not be performed once, and a plurality of temperature sweeps may be performed.

For example, the learning process is performed by an information processing apparatus (PC or the like) that is different from the integrated circuit device 20 according to the embodiment. Specifically, a process of determining an appropriate weight and an appropriate bias is performed using backpropagation or the like described above, and the obtained weight and the obtained bias are written into the storage unit 24 of the integrated circuit device 20 as the parameters of the temperature estimation process or the temperature compensation process.

Figure 22:
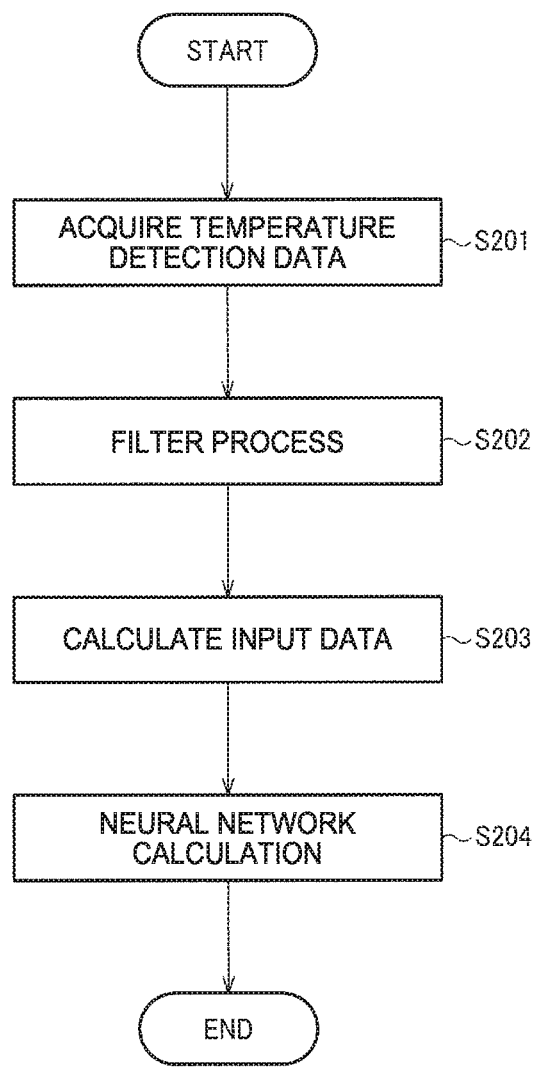
FIG. 22 is a flowchart for describing the process of estimating the temperature of a temperature detection target device.

FIG. 22 is a flowchart for describing the temperature estimation process executed by the integrated circuit device 20 (digital signal processing circuit 23) according to the embodiment. In a case where the process is started, the digital signal processing circuit 23 acquires the first to N-th temperature detection data TD1 to TDN from the first to N-th temperature sensors 26 (S201) and performs a noise reduction filter process (S202).

Next, the digital signal processing circuit 23 performs a process of obtaining the input data Xin of the neural network based on the first to N-th temperature detection data TD1 to TDN (S203). As described above, this process is calculation of repeated multiplication and calculation of the amount of change in time. The neural network calculation is performed with the calculated input data Xin as input in accordance with the weight and the bias acquired by the learning process (S204). In the neural network, the number of neurons in the output layer is one, and the temperature estimation value or the frequency control data is output.

4. Physical Quantity Measurement Device

The method of the embodiment can be applied to the resonator device 2 including the integrated circuit device 20 and the resonator 10 as a temperature detection target device. The resonator 10 is supported by the integrated circuit device 20 through the connection terminal. More specifically, the resonator 10 is supported on the active surface AF side of the integrated circuit device 20 using conductive bumps (BU1 to BU3 or BU1 to BU4) formed in terminals (T1 to T3 or T1 to T4).

Figure 23:
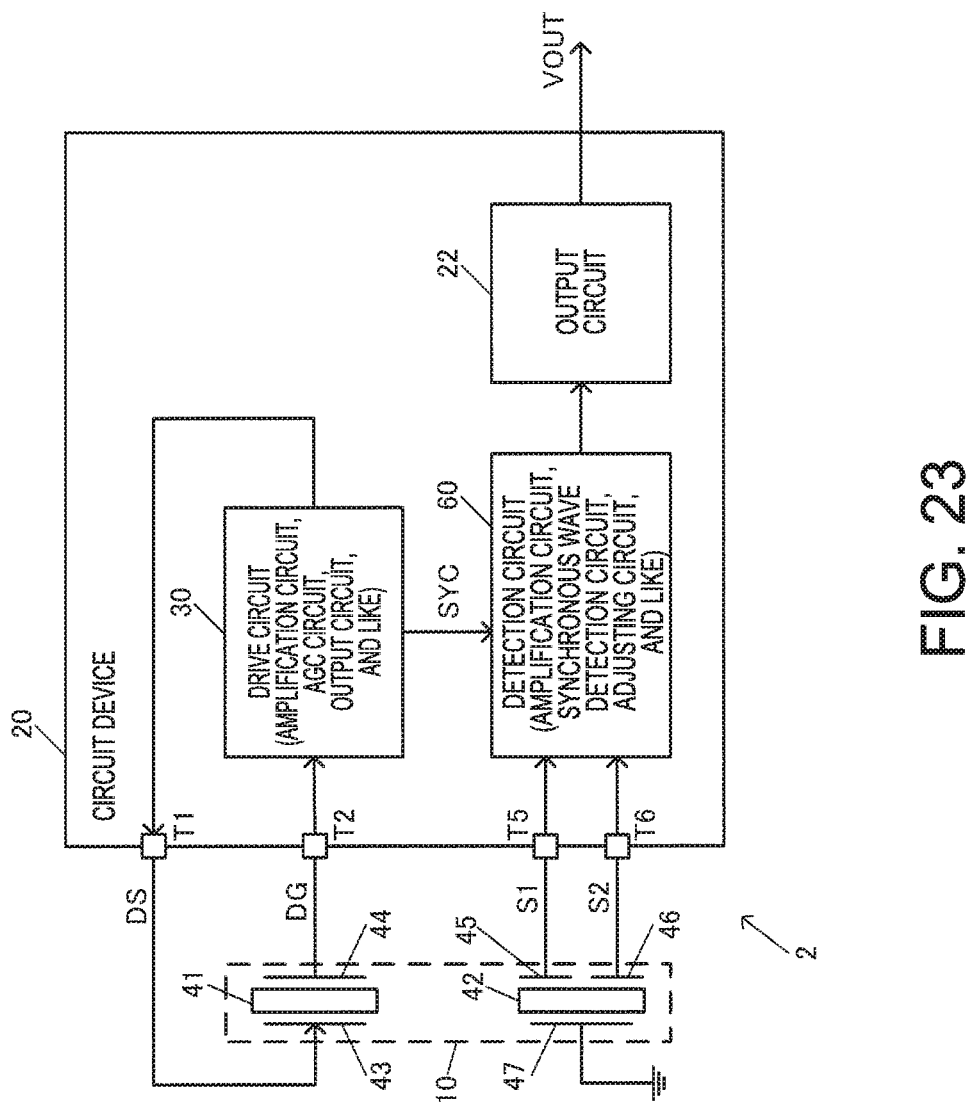
FIG. 23 is a configuration example of the resonator device that is a physical quantity measurement device.
Figure 24:
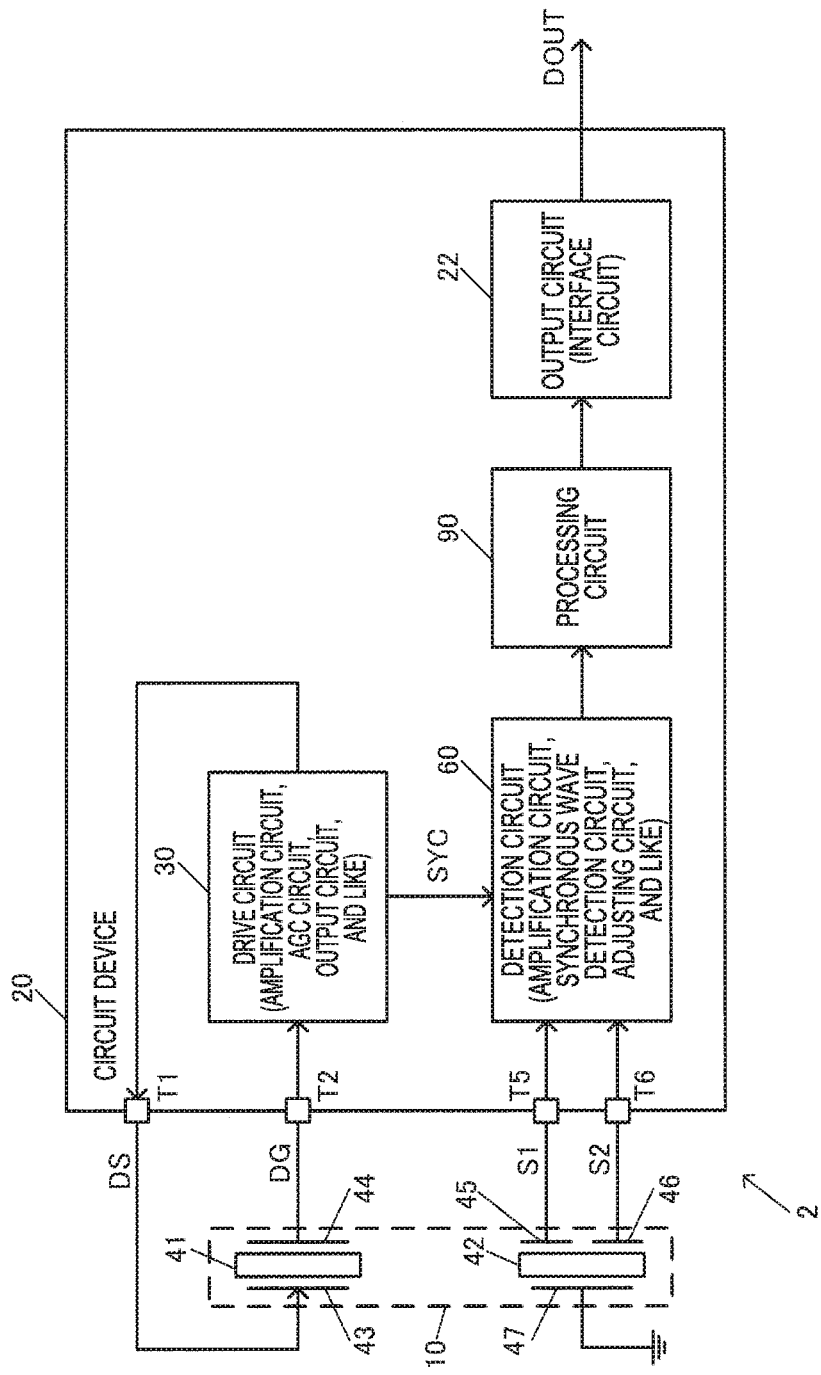
FIG. 24 is a configuration example of the resonator device that is a physical quantity measurement device.

While a case where the resonator device 2 is an oscillator is described above as a main example, the resonator device 2 of the embodiment may be a physical quantity measurement device (physical quantity detection device) for measuring a physical quantity. Various physical quantities such as angular velocity, acceleration, angular acceleration, speed, distance, and time can be assumed as the measured physical quantity. FIG. 23 and FIG. 24 illustrate a configuration example of the resonator device 2 as the physical quantity measurement device.

The resonator device 2 in FIG. 23 includes the resonator 10 and the integrated circuit device 20, and the integrated circuit device 20 includes the drive circuit 30, a detection circuit 60, and the output circuit 22. Specifically, the integrated circuit device 20 includes the detection circuit 60 that detects physical quantity information corresponding to detection signals S1 and S2 based on the detection signals S1 and S2 from the resonator 10 driven by the drive circuit 30. The output circuit 22 outputs a detection voltage VOUT based on a signal from the detection circuit 60.

The resonator 10 (a sensor element or a physical quantity transducer) is an element for detecting a physical quantity and includes resonator elements 41 and 42, drive electrodes 43 and 44, detection electrodes 45 and 46, and a ground electrode 47. The resonator elements 41 and 42 are piezoelectric type resonator elements that are formed of a thin plate of a piezoelectric material such as quartz crystal. Specifically, the resonator elements 41 and 42 are resonator elements that are formed by Z cut quartz crystal substrates. The piezoelectric material of the resonator elements 41 and 42 may be a material other than quartz crystal such as ceramics or silicon.

The drive electrode 43 is supplied with a drive signal DS (in a wide sense, an output signal) from the drive circuit 30 of the integrated circuit device 20, thereby driving the resonator element 41 for driving. For example, the resonator element 41 corresponds to drive arms 48A to 48D in FIG. 25 described below. A feedback signal DG (in a wide sense, an input signal) from the drive electrode 44 is input into the drive circuit 30. For example, the feedback signal DG from resonance of the resonator element 41 is input into the drive circuit 30.

The resonator element 42 for detection resonates by resonance of the resonator element 41 for driving, and charges (current) generated by the resonance are input into the detection circuit 60 from the detection electrodes 45 and 46 as the detection signals S1 and S2. The ground electrode 47 is set to have a ground electric potential (GND). The detection circuit 60 detects the physical quantity information (angular velocity or the like) corresponding to the detection signals S1 and S2 based on the detection signals S1 and S2. While a case where the resonator 10 is a gyrosensor element will be described below as a main example, the embodiment is not limited to the example. The resonator 10 may be an element that detects other physical quantities such as acceleration. In addition, for example, while a resonator element having a double T type structure as in FIG. 25 described below can be used as the resonator 10, a resonator element of a tuning fork type, an H type, or the like may be used.

As illustrated in FIG. 23, the integrated circuit device 20 includes terminals T1, T2, T5, and T6, corresponding to connection terminals, the drive circuit 30, the detection circuit 60, and the output circuit 22. The drive signal DS that is the output signal of the drive circuit 30 is output to the resonator 10 from the terminal T1 (first terminal). The feedback signal DG that is the input signal into the drive circuit 30 from the resonator 10 is input into the terminal T2 (second terminal). The drive circuit 30 can include an amplification circuit that performs signal amplification with the feedback signal DG from the resonator 10 as input, an AGC circuit (gain control circuit) that performs automatic gain control, an output circuit that outputs the drive signal DS to the resonator 10, and the like. For example, the AGC circuit automatically adjusts gain in a variable manner such that the amplitude of the feedback signal DG from the resonator 10 is constant. The AGC circuit can be implemented by a full wave rectifier that performs full wave rectification on a signal from the amplification circuit, an integrator that performs an integration process on the output signal of the full wave rectifier, and the like. For example, the output circuit outputs the drive signal DS of a rectangular wave. In this case, the output circuit can be implemented by a comparator, a buffer circuit, and the like. The output circuit may output the drive signal DS of a sine wave. In addition, for example, the drive circuit 30 generates a synchronization signal SYC based on the output signal of the amplification circuit and outputs the synchronization signal SYC to the detection circuit 60.

The detection circuit 60 can include an amplification circuit, a synchronous wave detection circuit, an adjusting circuit, and the like. The detection signals S1 and S2 from the resonator 10 are input into the amplification circuit through the terminals T1 and T2, and the amplification circuit performs charge-voltage conversion and signal amplification on the detection signals S1 and S2. The detection signals S1 and S2 constitute a differential signal. Specifically, the amplification circuit can include a first Q/V conversion circuit that amplifies the detection signal S1, a second Q/V conversion circuit that amplifies the detection signal S2, and a differential amplifier that amplifies the difference between the output signals of the first and second Q/V conversion circuits. The synchronous wave detection circuit performs synchronous wave detection using the synchronization signal SYC from the drive circuit 30. For example, synchronous wave detection for extracting a desired wave from the detection signals S1 and S2 is performed. The adjusting circuit performs offset adjustment for zero point correction and gain correction for sensitivity adjustment. In addition, the detection circuit 60 can include a filter circuit that attenuates an unnecessary signal that is not removed by the synchronous wave detection and the like.

The output circuit 22 buffers the detection voltage VOUT from the detection circuit 60 and outputs the buffered detection voltage VOUT to the outside. In the case of a gyrosensor, the detection voltage VOUT is a voltage signal of which the voltage changes depending on the detected angular velocity.

In FIG. 24, the detection circuit 60 includes an A/D conversion circuit unlike that in FIG. 23. Digital detection data from the detection circuit 60 is input into a processing circuit 90. Based on the detection data from the detection circuit 60, the processing circuit 90 performs various correction processes such as a correction process for offset adjustment and a correction process for sensitivity adjustment. The output circuit 22 outputs detection data DOUT after the correction process from the processing circuit 90 to the outside. In this case, the output circuit 22 may be implemented by an interface circuit such as I2C or SPI.

Figure 25:
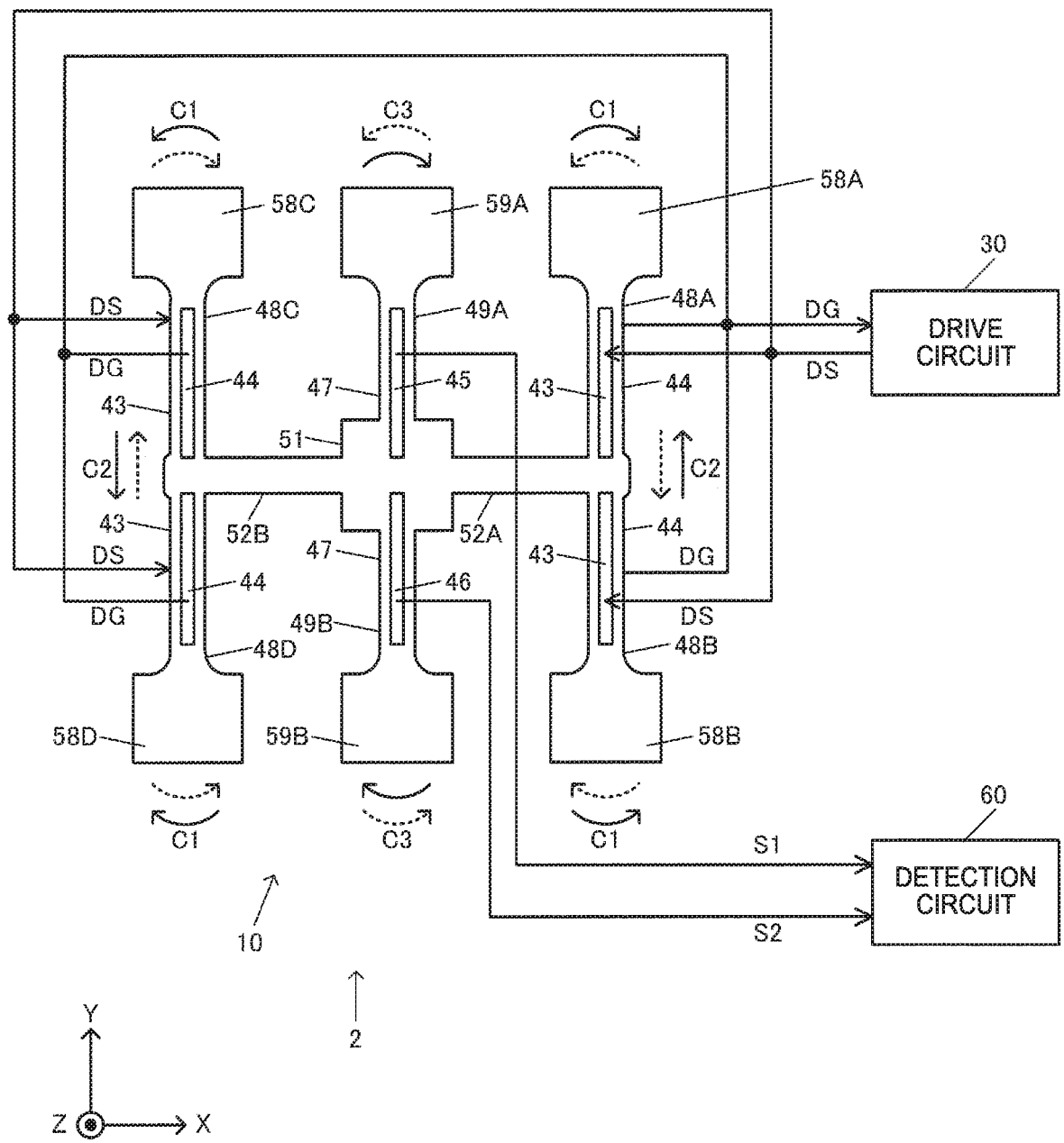
FIG. 25 is a descriptive diagram of the operation of the resonator device that is a physical quantity measurement device.

FIG. 25 illustrates one example of a configuration of the resonator 10 having a double T type structure. The resonator 10 includes the drive arms 48A, 48B, 48C, and 48D, detection arms 49A and 49B, a base portion 51, and connection arms 52A and 52B. The detection arms 49A and 49B extend from the base portion 51 of a rectangular shape in a +Y axis direction and a −Y axis direction. In addition, the connection arms 52A and 52B extend from the base portion in a +X axis direction and a −X axis direction. The drive arms 48A and 48B extend from the tip end portion of the connection arm 52A in the +Y axis direction and the −Y axis direction. The drive arms 48C and 48D extend from the tip end portion of the connection arm 52B in the +Y axis direction and the −Y axis direction. Wide anchor portions 58A, 58B, 58C, and 58D (hammer heads) disposed on the tip end side of the drive arms 48A, 48B, 48C, and 48D and wide anchor portions 59A and 59B (hammer heads) disposed on the tip end side of the detection arms 49A and 49B are used as an anchor for frequency adjustment. In a case where a Z axis is set in the thickness direction of the resonator 10, the resonator 10 detects the angular velocity about the Z axis. The X axis and the Y axis are coordinate axes orthogonal to the Z axis. The X axis and the Y axis are orthogonal to each other. The X axis, the Y axis, and the Z axis are called the electrical axis, the mechanical axis, and the optical axis of a quartz crystal substrate, respectively.

The drive electrode 43 is formed on the upper surface and the lower surface of the drive arms 48A and 48B. The drive electrode 44 is formed on the right side surface and the left side surface of the drive arms 48A and 48B. The drive electrode 44 is formed on the upper surface and the lower surface of the drive arms 48C and 48D. The drive electrode 43 is formed on the right side surface and the left side surface of the drive arms 48C and 48D. The drive signal DS (in a wide sense, an output signal) from the drive circuit 30 is supplied to the drive electrode 43 (in a wide sense, a first electrode), and the feedback signal DG (in a wide sense, an input signal) from the drive electrode 44 (in a wide sense, a second electrode) is input into the drive circuit 30. The detection electrode 45 is formed on the upper surface and the lower surface of the detection arm 49A. The ground electrode 47 is formed on the right side surface and the left side surface of the detection arm 49A. The detection electrode 46 is formed on the upper surface and the lower surface of the detection arm 49B. The ground electrode 47 is formed on the right side surface and the left side surface of the detection arm 49B. The detection signals S1 and S2 from the detection electrodes 45 and 46 are input into the detection circuit 60.

Next, the operation of the resonator device 2 will be described using FIG. 25. In a case where the drive signal DS is applied to the drive electrode 43 by the drive circuit 30, the drive arms 48A, 48B, 48C, and 48D perform flexural vibration (excited vibration) due to an inverse piezoelectric effect as illustrated by an arrow C1 in FIG. 25. For example, a vibration mode illustrated by a solid arrow and a vibration mode illustrated by a dotted arrow are repeated at a predetermined frequency. That is, flexural vibration in which the tip ends of the drive arms 48A and 48C repeatedly approach to and recede from each other, and the tip ends of the drive arms 48B and 48D repeatedly approach to and recede from each other is performed. At this point, the drive arms 48A and 48B, and the drive arms 48C and 48D perform axial symmetric vibration about the X axis that passes through the position of the center of mass of the base portion 51. Thus, the base portion 51, the connection arms 52A and 52B, and the detection arms 49A and 49B barely vibrate.

In such a state, in a case where an angular velocity with the Z axis as an axis of rotation is applied to the resonator 10 (in a case where the resonator 10 rotates about the Z axis), the drive arms 48A, 48B, 48C, and 48D vibrate by Coriolis force as illustrated by an arrow C2. That is, the Coriolis force in the direction of the arrow C2 orthogonal to the direction of the arrow C1 and the direction of the Z axis is applied to the drive arms 48A, 48B, 48C, and 48D, thereby generating a vibration component in the direction of the arrow C2. The vibration in the arrow C2 is transmitted to the base portion 51 through the connection arms 52A and 52B. Accordingly, the detection arms 49A and 49B perform flexural vibration in the direction of an arrow C3. Charge signals that are generated by a piezoelectric effect caused by flexural vibration of the detection arms 49A and 49B are input into the detection circuit 60 as the detection signal S1 and S2, and the angular velocity about the Z axis is detected. For example, in a case where the angular velocity of the resonator 10 about the Z axis is denoted by $\omega$, the mass of the resonator 10 is denoted by m, and the vibration velocity of the resonator 10 is denoted by v, the Coriolis force is denoted by $Fc=2$ m·v·$\omega$. Accordingly, the angular velocity $\omega$ about the Z axis can be obtained by causing the detection circuit 60 to detect a desired signal that is a signal corresponding to the Coriolis force.

5. Electronic Device and Vehicle

Figure 26:
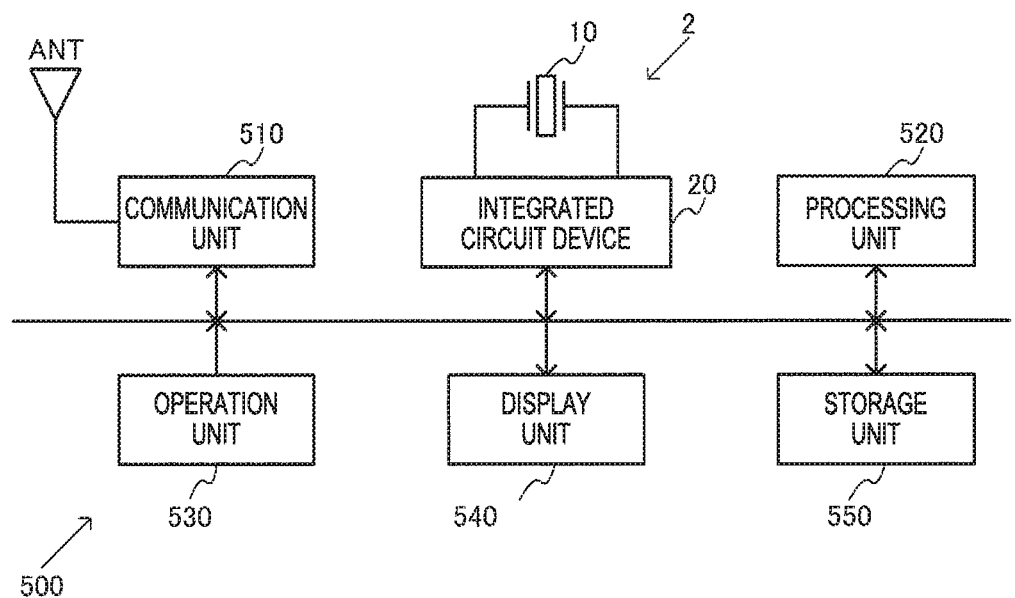
FIG. 26 is a configuration example of an electronic device.

FIG. 26 illustrates a configuration example of an electronic device 500 that includes the resonator device 2 (integrated circuit device 20) of the embodiment. The electronic device 500 includes the resonator device 2 including the integrated circuit device 20 and the resonator 10, and a processing unit 520. In addition, a communication unit 510, an operation unit 530, a display unit 540, a storage unit 550, and an antenna ANT can be included.

It can be assumed that the electronic device 500 is, for example, a network-related device such as a base station or a router, a high accuracy measurement device that measures a physical quantity such as a distance, a time, a flow speed, or a flow rate, a biometric information measurement device (an ultrasonic measurement device, a pulse wave meter, a blood pressure measurement device, or the like) that measures biometric information, or a vehicle-mounted device (a device or the like for automatic driving). In addition, it can be assumed that the electronic device 500 is a wearable device such as a head mounted type display device or a timepiece-related device, a robot, a printing device, a projection device, a portable information terminal (smartphone or the like) a contents providing device that distributes contents, or a video device such as a digital camera or a video camera.

The communication unit 510 (communication interface) performs a process of receiving data from the outside or transmitting data to the outside through the antenna ANT. The processing unit 520 (processor) performs a control process for the electronic device 500 and various digital processes and the like for the data transmitted and received through the communication unit 510. The function of the processing unit 520 can be implemented by a processor such as a microcomputer. The operation unit 530 (operation interface) is used for a user to perform an input operation and can be implemented by an operation button, a touch panel display, or the like. The display unit 540 displays various information and can be implemented by, for example, a liquid crystal or an organic EL display. The storage unit 550 stores data. The function of the storage unit 550 can be implemented by a semiconductor memory such as RAM or ROM, a hard disk drive (HDD), or the like.

Figure 27:
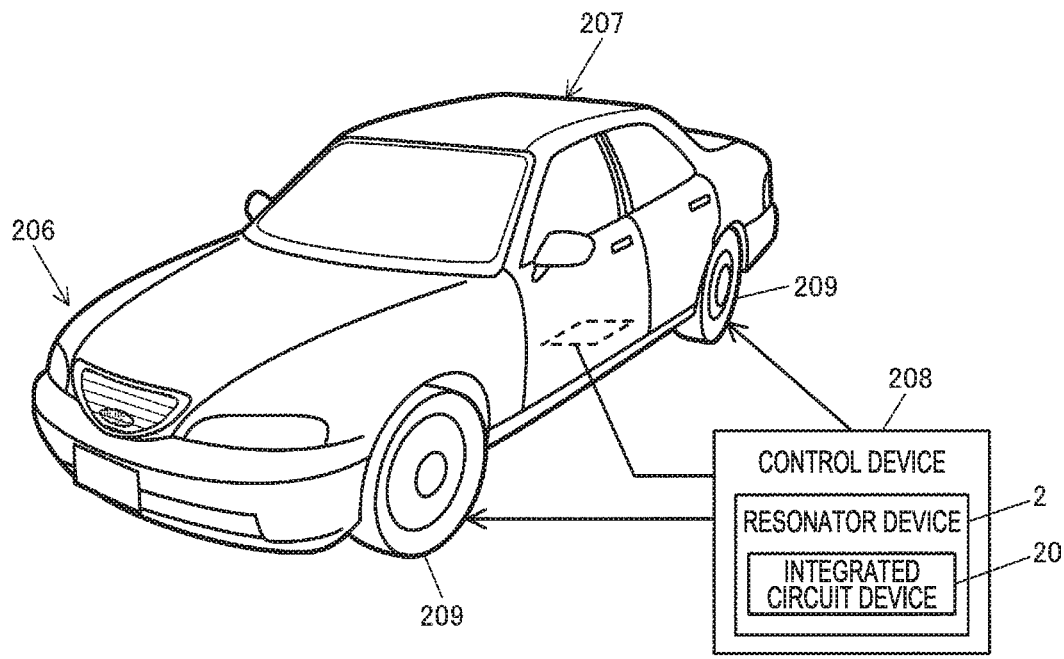
FIG. 27 is a configuration example of a vehicle.

FIG. 27 illustrates an example of a vehicle that includes the resonator device 2 (integrated circuit device 20) of the embodiment. The resonator device 2 (an oscillator or a physical quantity measurement device) of the embodiment can be embedded in various vehicles such as a car, an airplane, a motorcycle, a bicycle, a robot, and a ship. The vehicle is a device or an apparatus that includes a drive mechanism such as an engine or a motor, a steering mechanism such as a steering wheel or a rudder, and various electronic devices (vehicle-mounted devices) and moves on the ground, in the air, or on the sea. FIG. 27 schematically illustrates an automobile 206 as a specific example of the vehicle. The resonator device 2 of the embodiment is embedded in the automobile 206. A control device 208 performs various control processes based on the clock signal generated by the resonator device 2 or physical quantity information measured by the resonator device 2. For example, in a case where distance information related to an object around the automobile 206 is measured as the physical quantity information, the control device 208 performs various control processes for automatic driving using the measured distance information. For example, the control device 208 controls the firmness of suspension or controls brakes of individual wheels 209 depending on the attitude of a vehicle body 207. A device in which the resonator device 2 of the embodiment is embedded is not limited to the control device 208. The resonator device 2 can be embedded in various devices disposed in the vehicle such as the automobile 206 or a robot.

While the embodiment is described in detail above, it can be easily perceived by those skilled in the art that many modifications can be made without substantially departing from the novel matters and effects of the invention. While a resonator is illustratively described as a temperature detection target device in the embodiment, the temperature detection target device is not limited to the example and may be, for example, a gas cell included in a pressure sensor or an atomic oscillator. Accordingly, all of such modification examples fall within the scope of the invention. For example, a term that is used at least once along with a different term having a wider sense or the same sense in the specification or the drawings can be replaced with the different term at any location in the specification or the drawings. In addition, all combinations of the embodiment and the modification examples fall within the scope of the invention. In addition, the configuration and operation of the resonator device, the circuit device, the electronic device, and the vehicle and the arrangement configuration, the connection configuration, and the like of the resonator, the relay substrate, and the circuit device in the resonator device are not limited to those described in the embodiment, and various modifications can be made.

The entire disclosure of Japanese Patent Application No. 2018-011419, filed Jan. 26, 2018 is expressly incorporated by reference herein.

What is claimed is:

1. An integrated circuit device electrically coupled to a temperature detection target device, comprising:
   a first temperature sensor;
   a second temperature sensor;
   an A/D conversion circuit that performs A/D conversion on a first temperature detection voltage from the first temperature sensor and outputs first temperature detection data, and performs A/D conversion on a second temperature detection voltage from the second temperature sensor and outputs second temperature detection data;
   a connection terminal electrically coupled to the temperature detection target device;
   a digital signal processing circuit that performs digital calculation based on the first temperature detection data and the second temperature detection data and performs a temperature compensation process of correcting temperature characteristics of the temperature detection target device;
   a power supply terminal where a power supply voltage is supplied; and
   an output terminal from which a signal is output,
   wherein a distance between the first temperature sensor and the connection terminal is smaller than at least one of a distance between the first temperature sensor and the power supply terminal and a distance between the first temperature sensor and the output terminal.

2. The integrated circuit device according to claim 1, further comprising:
   a support terminal in which an electrode for supporting the temperature detection target device is disposed,
   wherein a distance between the second temperature sensor and the support terminal is smaller than at least one of a distance between the second temperature sensor and the power supply terminal and a distance between the second temperature sensor and the output terminal.

3. The integrated circuit device according to claim 1, further comprising:
   a support terminal in which an electrode for supporting a relay substrate in which wiring that electrically connects the temperature detection target device and the integrated circuit device is formed is disposed,
   wherein a distance between the second temperature sensor and the support terminal is smaller than at least one of a distance between the second temperature sensor and the power supply terminal and a distance between the second temperature sensor and the output terminal.

4. The integrated circuit device according to claim 1, wherein the temperature detection target device is a resonator, and
   the integrated circuit device includes a drive circuit that drives the resonator.

5. An electronic device comprising:
   the integrated circuit device according to claim 1.

6. A vehicle comprising:
   the integrated circuit device according to claim 1.

7. An integrated circuit device electrically coupled to a temperature detection target device, comprising:
   a first temperature sensor;
   a second temperature sensor;
   an A/D conversion circuit that performs A/D conversion on a first temperature detection voltage from the first temperature sensor and outputs first temperature detection data, and performs A/D conversion on a second temperature detection voltage from the second temperature sensor and outputs second temperature detection data;

a connection terminal electrically coupled to the temperature detection target device; and a digital signal processing circuit that performs digital calculation based on the first temperature detection data and the second temperature detection data and performs a temperature compensation process of correcting temperature characteristics of the temperature detection target device, wherein the digital signal processing circuit corrects the temperature characteristics of the temperature detection target device by a neural network calculation process based on the first temperature detection data and the second temperature detection data.

8. The integrated circuit device according to claim 7, wherein the digital signal processing circuit corrects the temperature characteristics of the temperature detection target device by the neural network calculation process based on an amount of change in time of at least one of the first temperature detection data and the second temperature detection data.

9. A resonator device comprising:

the integrated circuit device according to claim 7; and the temperature detection target device, wherein the temperature detection target device is a resonator.

10. The resonator device according to claim 9, wherein the resonator is supported by the integrated circuit device through the connection terminal.

11. An integrated circuit device electrically coupled to a temperature detection target device, comprising:

a first temperature sensor;

a second temperature sensor;

an A/D conversion circuit that performs A/D conversion on a first temperature detection voltage from the first temperature sensor and outputs first temperature detection data, and performs A/D conversion on a second temperature detection voltage from the second temperature sensor and outputs second temperature detection data;

a connection terminal electrically coupled to the temperature detection target device; and a digital signal processing circuit that performs digital calculation based on the first temperature detection data and the second temperature detection data and performs a temperature compensation process of correcting temperature characteristics of the temperature detection target device, wherein the digital signal processing circuit performs a heat circuit simulation process using heat resistance information and heat capacitance information related to a heat conduction model based on the first temperature detection data and the second temperature detection data and estimates a temperature of the temperature detection target device.

* * * * *